US012725664B2

(12) United States Patent
Li et al.

(10) Patent No.: US 12,725,664 B2

(45) Date of Patent: Sep. 1, 2026

(54) SUB-BLOCK MODE BACK PATTERN EFFECT COMPENSATION

(71) Applicant: Sandisk Technologies, Inc., Milpitas, CA (US)

(72) Inventors: Wei Li, Shanghai (CN); Jiacen Guo, Sunnyvale, CA (US); Weiyi Li, Fremont, CA (US); Yichen Wang, Shanghai (CN); Xiang Yang, Santa Clara, CA (US); Liang Li, Shanghai (CN); Ming Wang, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 189 days.

(21) Appl. No.: 18/584,636

(22) Filed: Feb. 22, 2024

(65) Prior Publication Data

US 2025/0273279 A1 Aug. 28, 2025

(51) Int. Cl.

| | |
|---|---|
| ***G11C 16/34*** | (2006.01) |
| ***G11C 16/04*** | (2006.01) |
| ***G11C 16/28*** | (2006.01) |

(52) U.S. Cl.

CPC ...... *G11C 16/3459* (2013.01); *G11C 16/0433* (2013.01); *G11C 16/28* (2013.01)

(58) Field of Classification Search

CPC .. G11C 16/3459; G11C 16/0433; G11C 16/28

See application file for complete search history.

(56) References Cited

U.S. PATENT DOCUMENTS

| | | | | |
|---|---|---|---|---|
| 7,876,611 | B2 | 1/2011 | Dutta et al. | |
| 8,743,615 | B2 | 6/2014 | Lee et al. | |
| 9,236,133 | B2 | 1/2016 | Yanamanamanda et al. | |
| 9,530,517 | B2 | 12/2016 | Lee et al. | |
| 9,564,233 | B1 | 2/2017 | Cho et al. | |
| 10,095,417 | B1 | 10/2018 | Jeon et al. | |
| 10,157,680 | B2 | 12/2018 | Yang et al. | |
| 10,665,299 | B1 * | 5/2020 | Lu | G11C 16/32 |
| 10,726,920 | B2 | 7/2020 | Yang | |
| 11,152,059 | B2 | 10/2021 | Papandreou et al. | |
| 11,189,337 | B1 | 11/2021 | Lien et al. | |
| 2013/0051148 | A1 | 2/2013 | Lee et al. | |
| 2016/0300621 | A1 * | 10/2016 | Abe | G11C 16/3445 |

(Continued)

OTHER PUBLICATIONS

U.S. Appl. No. 18/483,010, filed Oct. 9, 2023.

*Primary Examiner* — Amir Zarabian

*Assistant Examiner* — Bradley S Coon

(74) *Attorney, Agent, or Firm* — Pearl Cohen LLP

(57) ABSTRACT

Technology for compensation for a sub-block mode (SBM) back pattern effect. When in a sub-block mode, the memory system determines a magnitude for a program verify voltage for a selected word line in a selected sub-block in a selected block. The magnitude for the program verify voltage depends on a programmed status of the word lines in one or more unselected sub-blocks in the selected block when the program verify voltage is applied to the selected word line. The memory system may also determine a magnitude for a read reference voltage for the selected word line. The magnitude for the read reference voltage depends on a programmed status of the word lines in the one or more unselected sub-blocks in the selected block when the read reference voltage is applied to the selected word line.

13 Claims, 21 Drawing Sheets

(56) References Cited

U.S. PATENT DOCUMENTS

| | | | | |
|---|---|---|---|---|
| 2017/0287568 | A1* | 10/2017 | Yang | G11C 16/3418 |
| 2019/0019563 | A1* | 1/2019 | Lee | G11C 16/3459 |
| 2019/0051362 | A1* | 2/2019 | Lee | G11C 16/14 |
| 2020/0243147 | A1* | 7/2020 | Yang | G11C 16/16 |
| 2020/0411099 | A1* | 12/2020 | Lee | G11C 11/4074 |
| 2022/0293187 | A1 | 9/2022 | Guo et al. | |
| 2022/0415414 | A1* | 12/2022 | Moschiano | G11C 11/5635 |
| 2024/0319886 | A1* | 9/2024 | Zhang | G06F 3/0679 |
| 2025/0022517 | A1* | 1/2025 | Lee | G11C 16/08 |

* cited by examiner

Storage System 100
Memory Controller 120
Storage
130
Memory Interface
160
ECC Engine
158
Processor
156
NOC
154
Local Memory Controller
164
local memory
140
SBM back effect comp 157
Host Interface
152
Host
102

207

To NAND strings
BL3
BL2
BL1
BL0
225
225
225
225
325
Comparison circuit 320
Sense node latch 322
Managing Circuit 330
340
ADL
BDL
CDL
346
336
352
348
XDL
I/O Interface 332
334
Data of memory cells
E
P
Vev
Vr
Vv
Vt
Er
A
B
C
D
E
F
G
Vev
VrA
VvA
VrB
VvB
VrC
VvC
VrD
VvD
VrE
VvE
VrF
VvF
VrG
VvG
Vt

| Scenario | When Programming | | When Reading | |
|---|---|---|---|---|
| | Unselected SB Pattern | Selected SB Verify Level | Unselected SB Pattern | Selected SB Read Level |
| Scenario 1 | Open | Vv_def | Open | Vr_def |
| Scenario 2 | Open | Vv_def | Closed | Vr_def + Vr_BPE |
| Scenario 3 | Closed | Vv_def + Vv_BPE | Closed | Vr_def + Vr_BPE |
| Scenario 4 | Closed | Vv_def + Vv_BPE | Open | Vr_def |

Figure 11

| Case | When Programming | | When Reading | |
|---|---|---|---|---|
| | Unselected SB Pattern | Selected SB Verify Level | Unselected SB Pattern | Selected SB Read Level |
| Case 1 | Open ≤ PWLs < 1/4 | Vv_def | Open ≤ PWLs < 1/4 | Vr_def |
| Case 2 | 1/4 ≤ PWLs < 1/2 | Vv_def + Vv_BPE1 | 1/4 ≤ PWLs < 1/2 | Vr_def + Vr_BPE1 |
| Case 3 | 1/2 ≤ PWLs < 3/4 | Vv_def + Vv_BPE2 | 1/2 ≤ PWLs < 3/4 | Vr_def + Vr_BPE2 |
| Case 4 | 3/4 ≤ PWLs < close | Vv_def + Vv_BPE3 | 3/4 ≤ PWLs < close | Vr_def + Vr_BPE3 |

SUB-BLOCK MODE BACK PATTERN EFFECT COMPENSATION

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as physical blocks. For example, a physical block in a NAND memory system contains many NAND strings. A NAND string contains memory cell transistors connected in series, a drain side select gate at one end, and a source side select gate at the other end. Each NAND string is associated with a bit line. The physical block typically has many word lines that provide voltages to the control gates of the memory cell transistors. In some architectures, each word line connects to the control gate of one memory cell on each respective NAND string in the physical block.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials including a charge-trapping material to create a vertical column of memory cells (e.g., NAND string).

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

BRIEF DESCRIPTION OF THE DRAWINGS

Like-numbered elements refer to common components in the different figures.

FIG. 11 is a table of verify and read levels for an embodiment of compensation for sub-block mode back pattern effect in which the verify and read levels depend on the programmed status of the word lines in the one or more unselected sub-blocks at the time of program verify and read respectively.

DETAILED DESCRIPTION

Technology is disclosed that provides compensation for a sub-block mode (SBM) back pattern effect. When in an embodiment of a sub-block mode, the memory system determines a magnitude for a program verify voltage for a selected word line in a selected sub-block in a selected block. The magnitude for the program verify voltage depends on a programmed status of the word lines in one or more unselected sub-blocks in the selected block when the program verify voltage is applied to the selected word line. The memory system may also determine a magnitude for a read reference voltage for the selected word line while the memory cells still store data that was program verified with the aforementioned program verify voltage. The magnitude for the read reference voltage may depend on a programmed status of the word lines in the one or more unselected sub-blocks in the selected block when the read reference voltage is applied to the selected word line. The program verify voltage and/or the read reference voltage may provide compensation for the SBM back pattern effect.

Herein, the term "selected memory cells" means the memory cells that have been selected for a memory operation such as program, read, or erase. Herein, the term "selected word line" means the word line connected to the selected memory cells. Herein, the term "selected block" means the block that contains the selected memory cells. Herein, the term "sub-block" means a portion of a block that contains a contiguous set of data word lines. A dummy memory cell does not store and is not eligible to store host data (data provided from the host, such as data from a user of the host), while a data memory cell is eligible to store host data. Word lines connected to data memory cells are referred to as "data word lines". Word lines connected to dummy memory cells are referred to as "dummy word lines". Herein, the term "selected sub-block" means the sub-block that contains the selected memory cells. Thus, the selected sub-block will contain the selected word line. Herein, the term "unselected sub-block" means all sub-blocks in the selected block other than the selected sub-block. Herein, the term "sub-block mode" ("SBM") means to erase and program the sub-blocks within a block independently. Herein, the term "programmed word line" means a data word line for which at least some of the memory cells have been programmed to a data state. Herein the term "open sub-block" means a sub-block for which no data word lines have been programmed. Herein the term "closed sub-block" means a sub-block for which all data word lines have been programmed.

Figure 1:
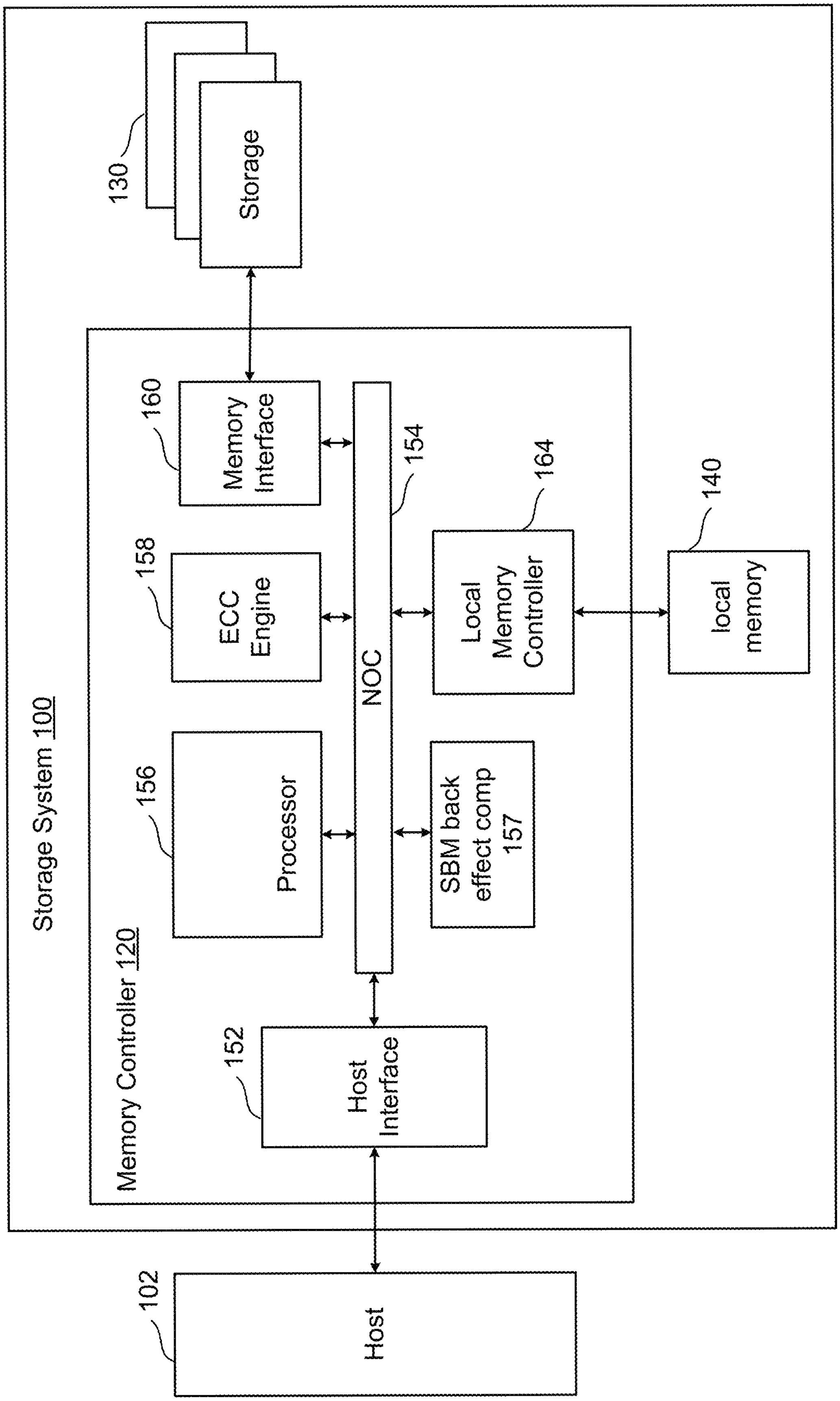
FIG. 1 is a block diagram depicting one embodiment of a storage system.

FIG. 1 is a block diagram of one embodiment of a storage system 100 that implements the technology described herein. In one embodiment, storage system 100 prevents provides compensation for sub-block mode back pattern effect as disclosed herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

The SBM back effect compensation 157 provides compensation for a back effect when in a SBM. In an embodiment, the SBM back effect compensation 157 determines suitable magnitudes for a program verify reference voltage and/or a read reference voltage to be applied to a selected word line in a selected sub-block in a selected block based on a programmed status in one or more unselected sub-blocks in the selected block. The SBM back effect compensation 157 may be implemented in software, hardware, or a combination of hardware and software. In an embodiment, the SBM back effect compensation 157 is implemented on the processor 156. Optionally, all or a portion of the SBM back effect compensation 157 may be implemented in storage 130. In an embodiment, SBM back effect compensation 157 performs one or more of process 1200 (see FIG. 12), process 1300 (see FIG. 13), and/or steps 1402 and 1404 of process 1400 (see FIG. 14).

Figure 2A:
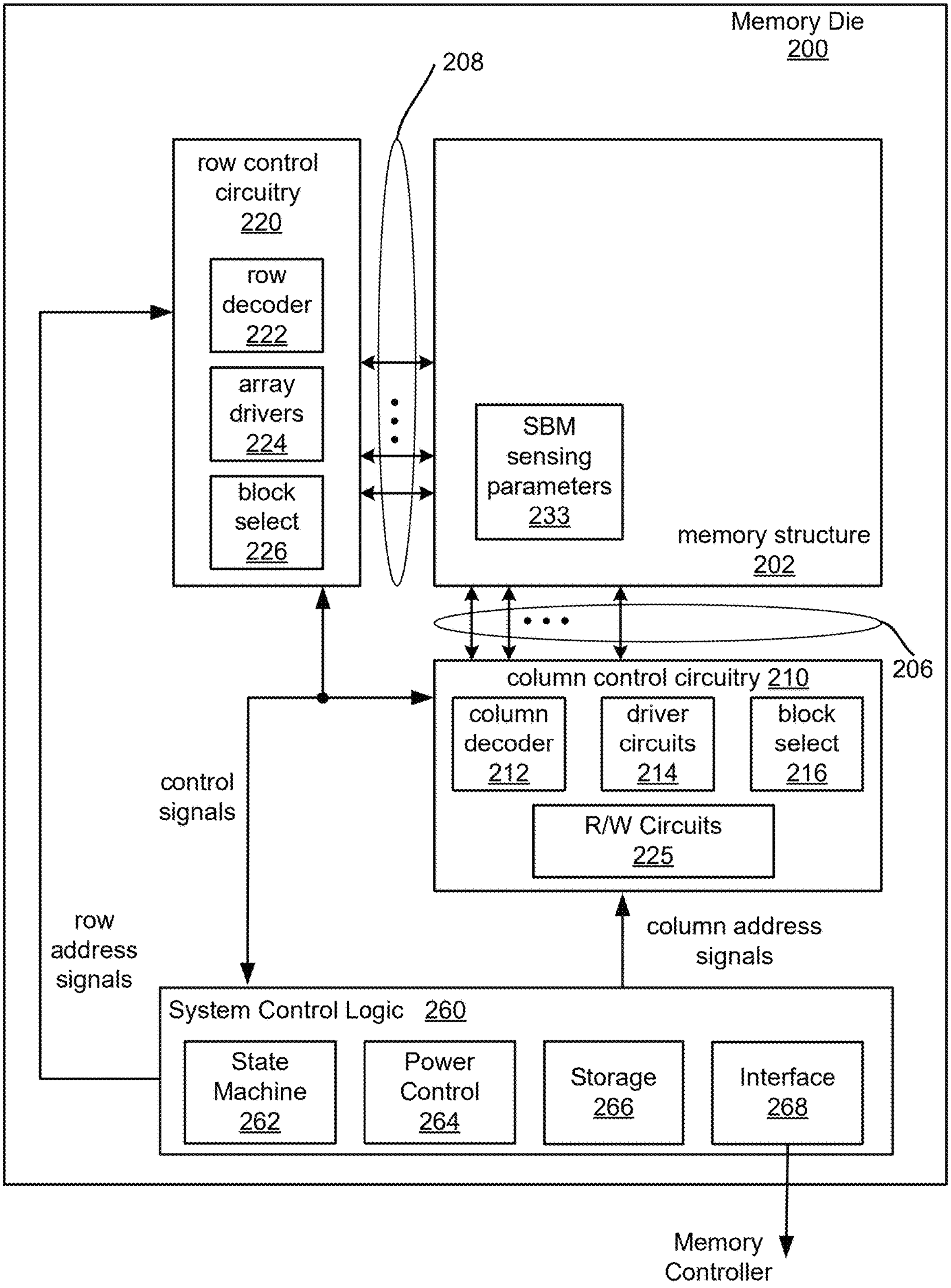
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In some embodiments, the state machine 262 applies reference voltages that provide compensation for sub-block mode back pattern effect in the memory structure 202. Sub-block mode (SBM) sensing parameters 233 may be stored in the memory structure 202. The SBM sensing parameters 233 may be read into storage 266 to be used by the state machine 262 for establishing the magnitudes of reference voltages when sensing memory cells in an SBM. The SBM sensing parameters 233 may include voltage offsets to program verify voltages and/or read reference voltages. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a “communication interface”). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
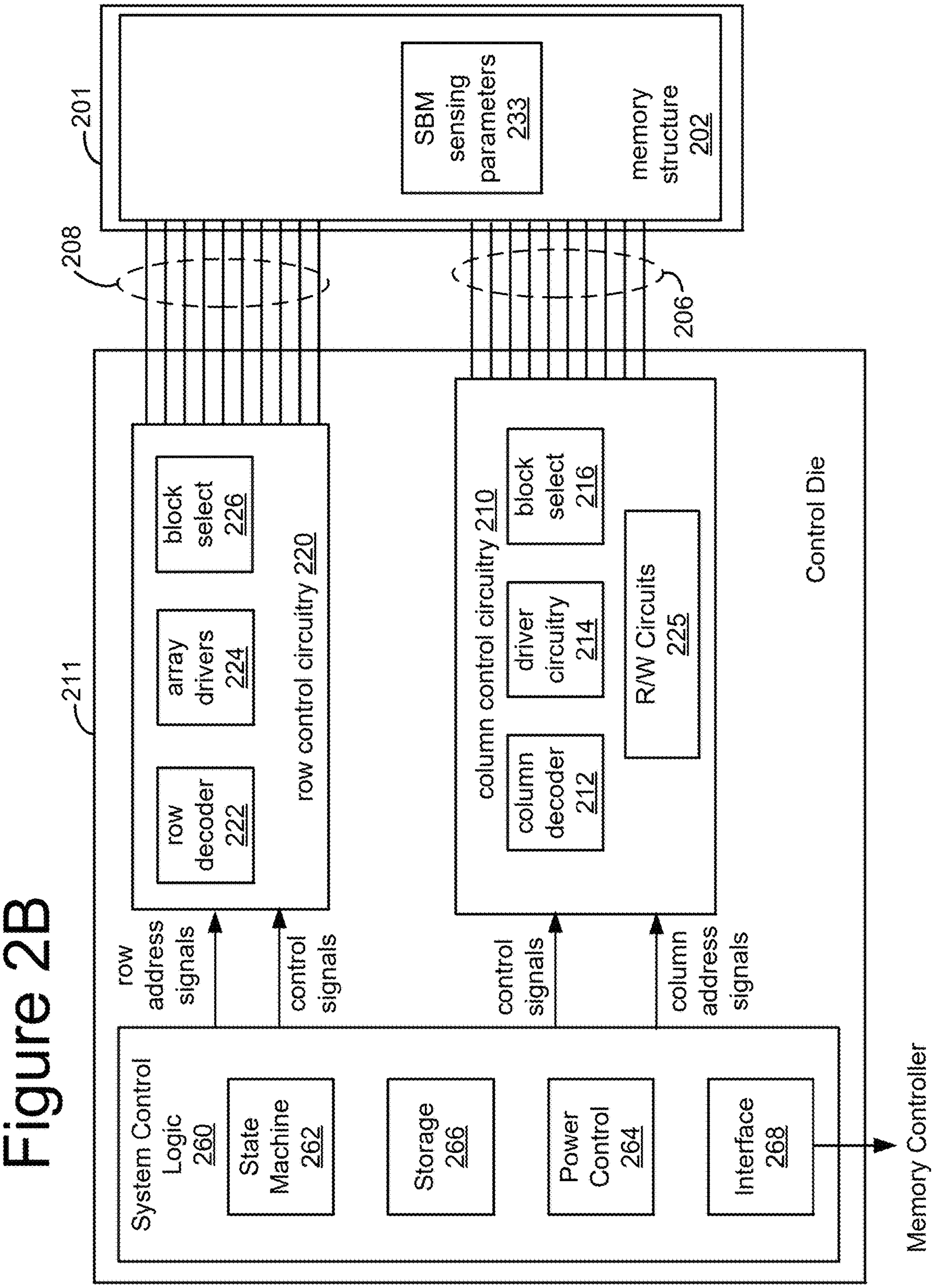
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
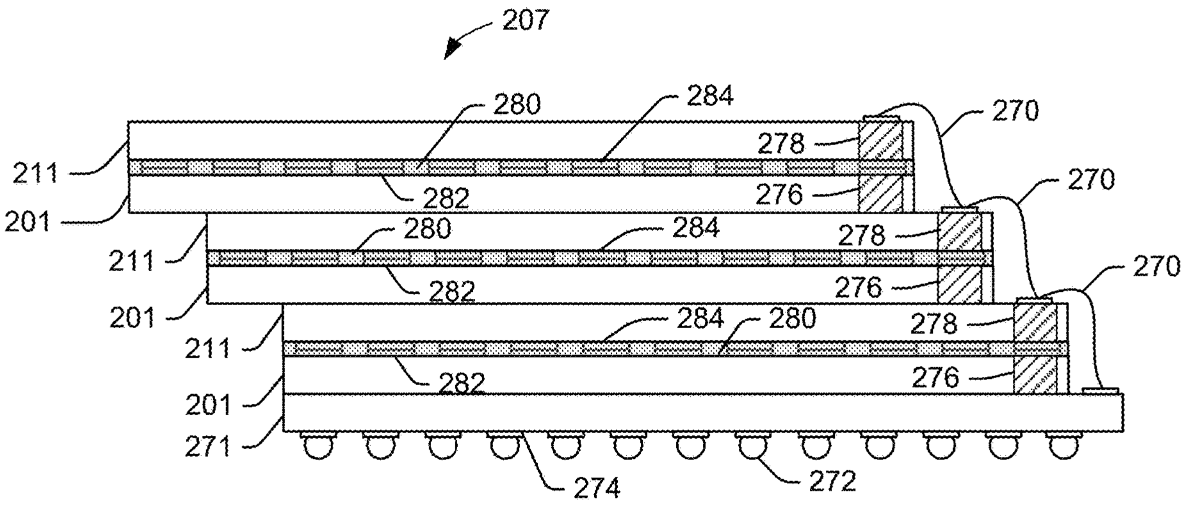
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
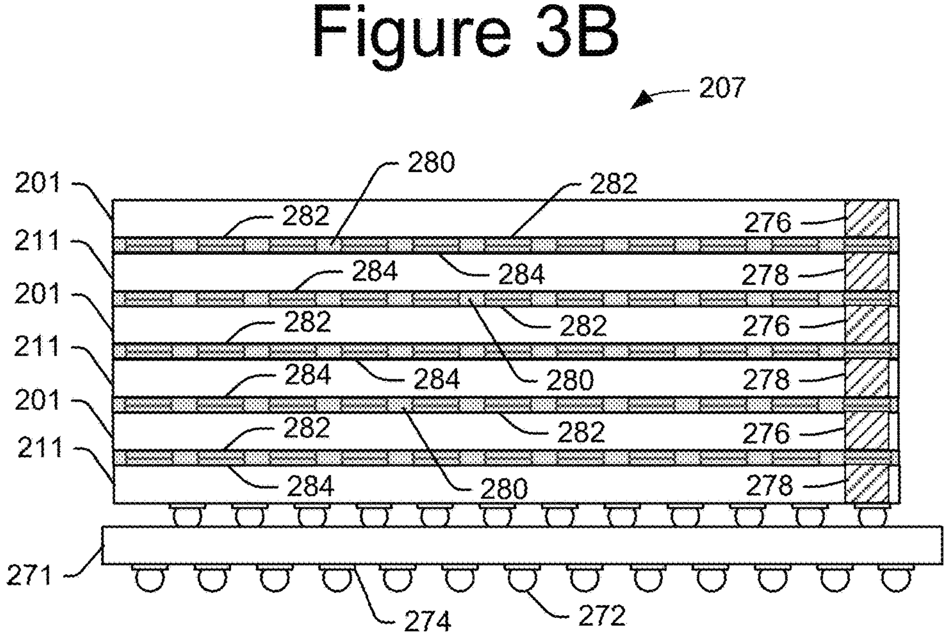

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
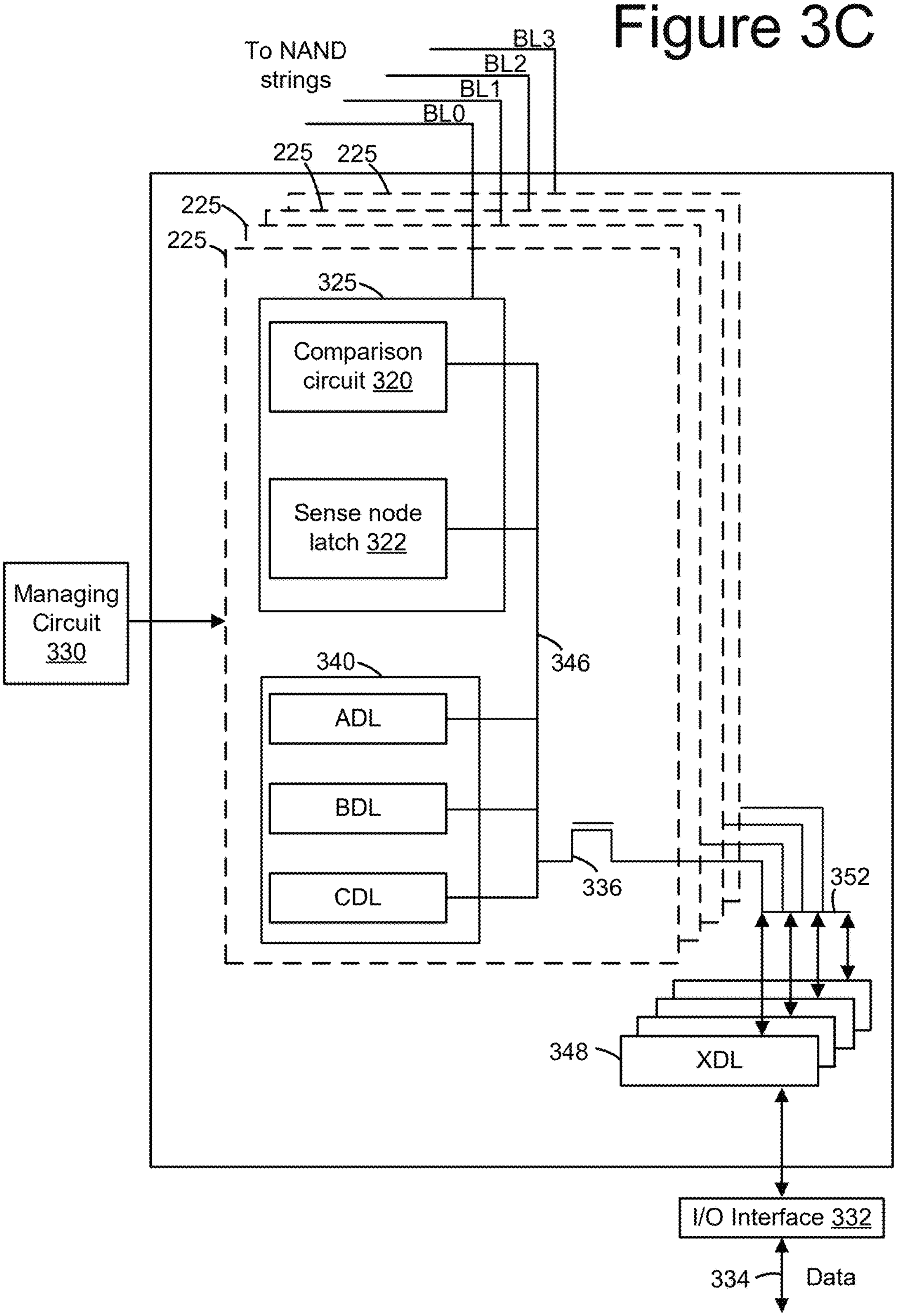
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
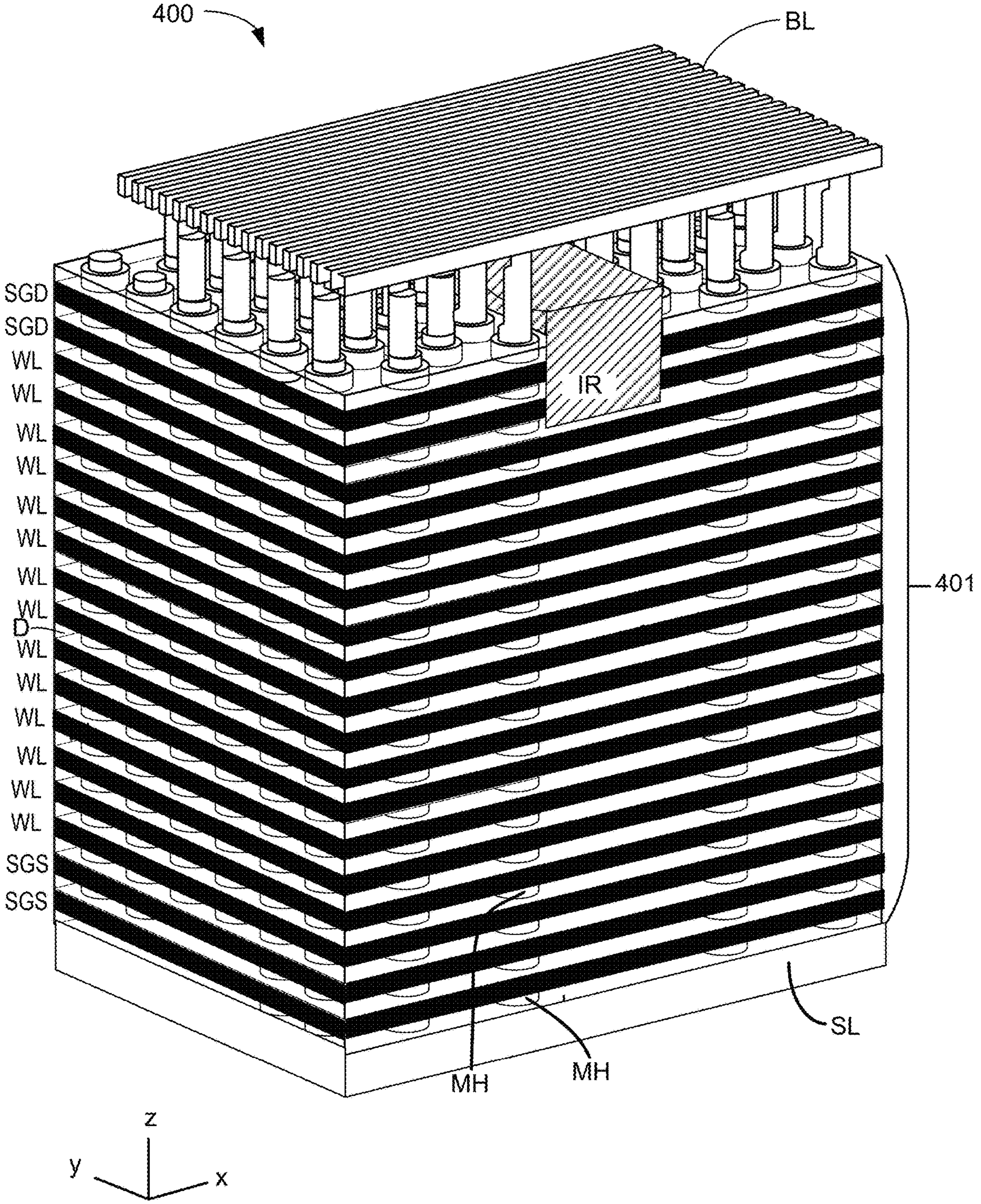
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "strings." Each of these "strings" has many NAND strings. In an embodiment, an isolation region (IR) divides the SGD layers into multiple SGD select lines, each of which is used to select a string (e.g., set of NAND strings). FIG. 4 depicts an example having one IR region and thereby two strings. However, there may be more than one IR region and thereby more than two strings. Optionally, the IR region can extend down through all of the alternating dielectric layers and conductive layers.

Figure 4A:
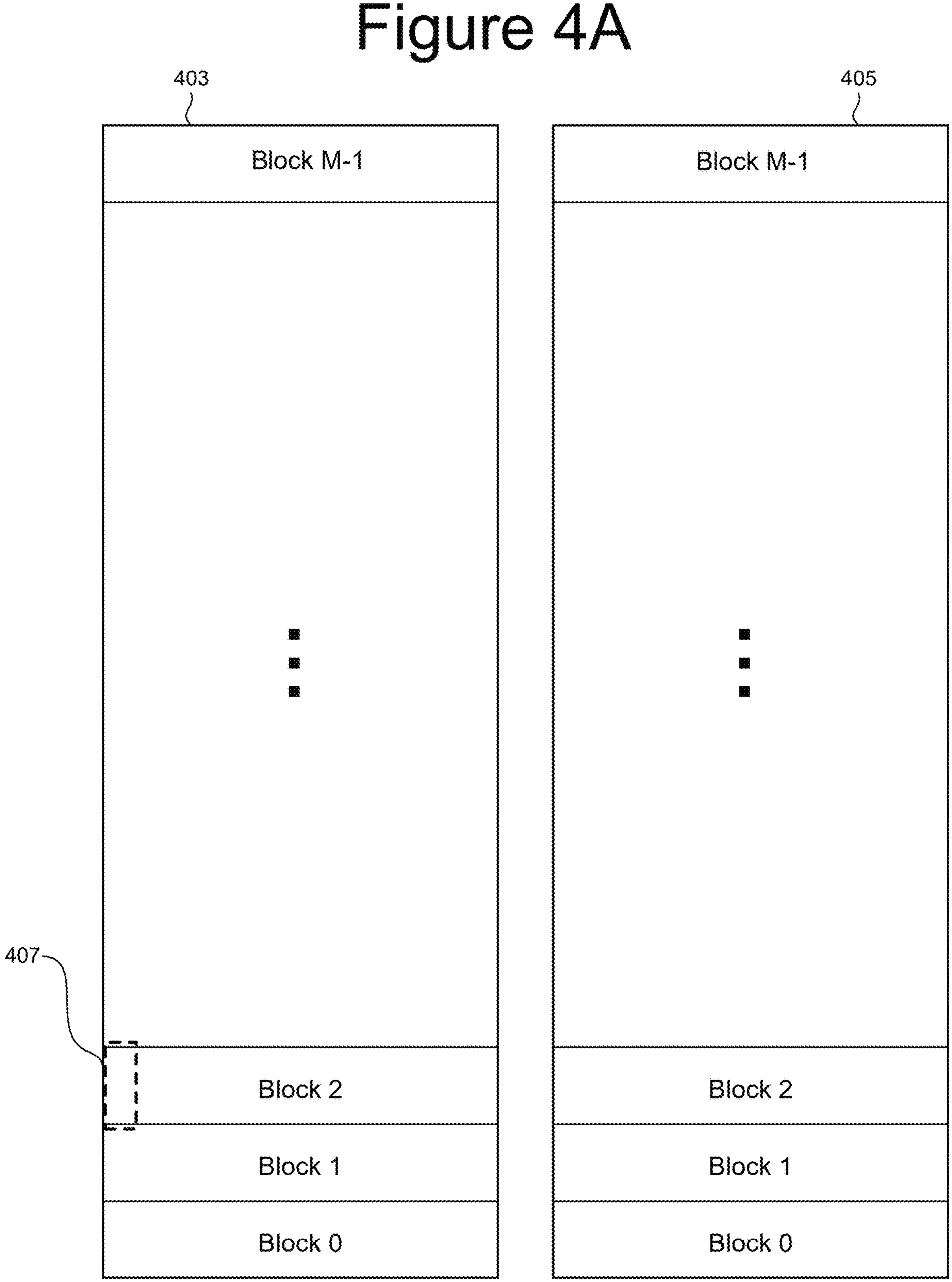
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
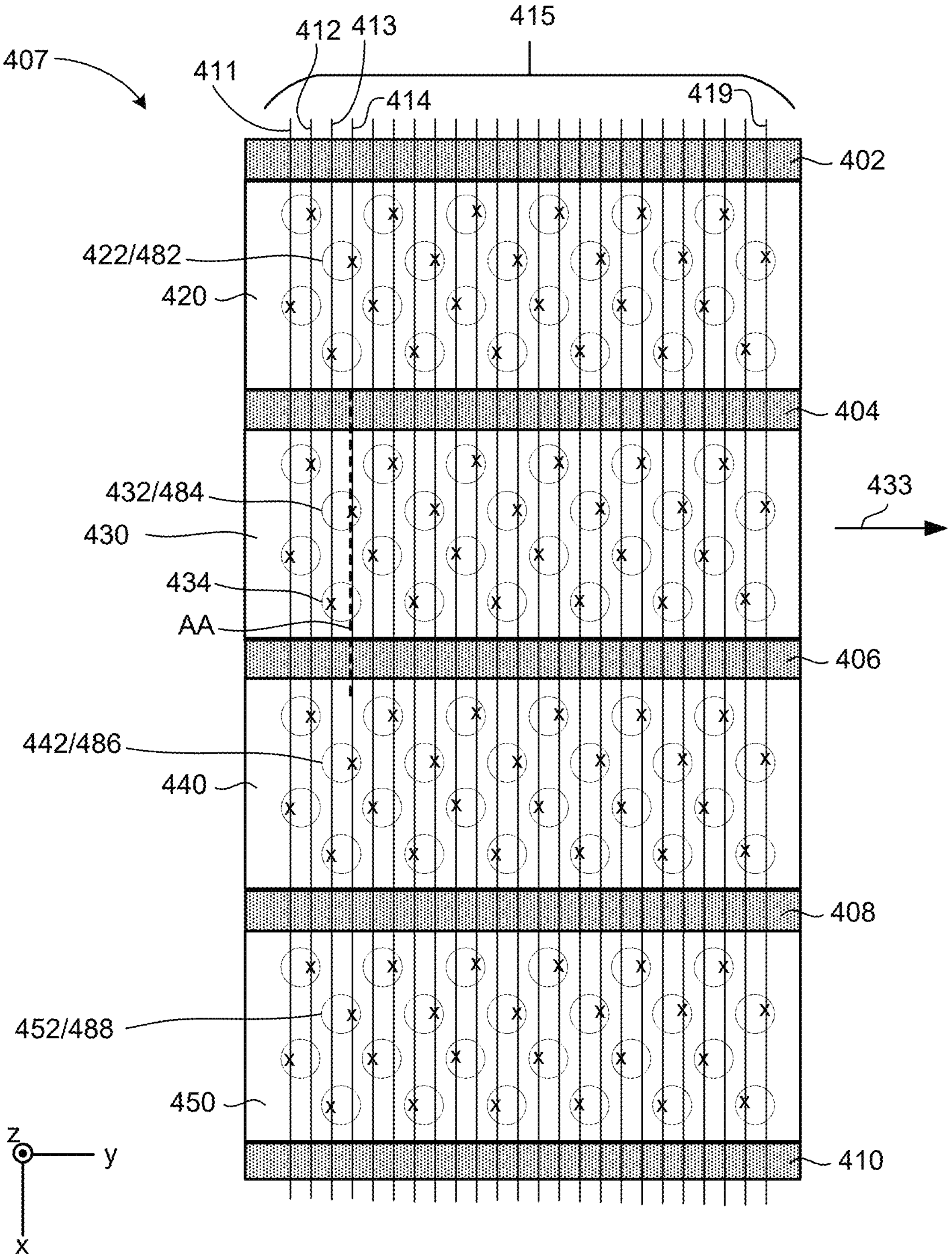
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "strings. Each string contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different strings an be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
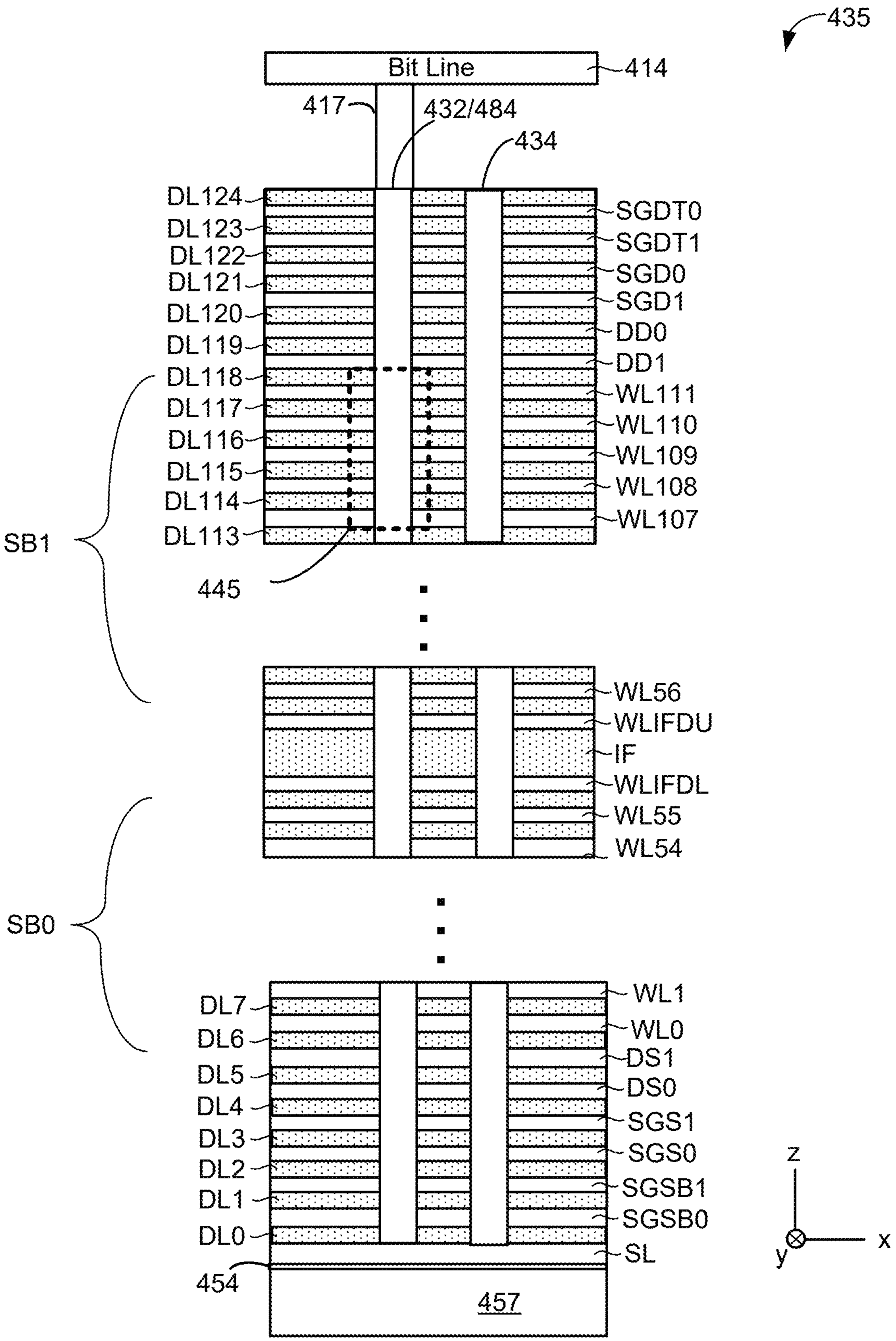
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two sub-blocks (SB). The two SB stack comprises SB0 and SB1. A two SB or other multi-SB stack can be used to form a relatively tall stack while maintaining a relatively narrow memory hole width (or diameter). After the layers of the lower SB are formed, memory hole portions are formed in the lower SB. Subsequently, after the layers of the upper SB are formed, memory hole portions are formed in the upper SB, aligned with the memory hole portions in the lower SB to form continuous memory holes from the bottom to the top of the stack. The resulting memory hole is narrower than would be the case if the hole were etched from the top to the bottom of the stack rather than in each SB individually. An interface (IF) region is created where the two SBs are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, SB0 and SB1 are erased independent of one another. Hence, data may be maintained in SB0 after SB1 is erased. Likewise, data may be maintained in the SB1 after SB0 is erased. Independently erasing the sub-blocks is referred to herein as a sub-block mode (SBM). When programming memory cells in a selected block during a SBM, the sub-block containing the memory cells being programmed is defined herein as the "selected sub-block". All other sub-blocks in the selected block (i.e., sub-blocks in the selected block that do not contain the selected memory cells) are defined herein as "un-selected sub-blocks." The programming status of the un-selected sub-blocks may impact the selected sub-block in what is referred to herein as a back pattern effect. In an embodiment, the magnitude of a program verify voltage during a SBM depends on the present programmed status of the unselected block(s). In an embodiment, the magnitude of a program verify voltage and the magnitude of a read reference voltage during a SBM depend on the present programmed status of the unselected block(s).

Figure 4D:
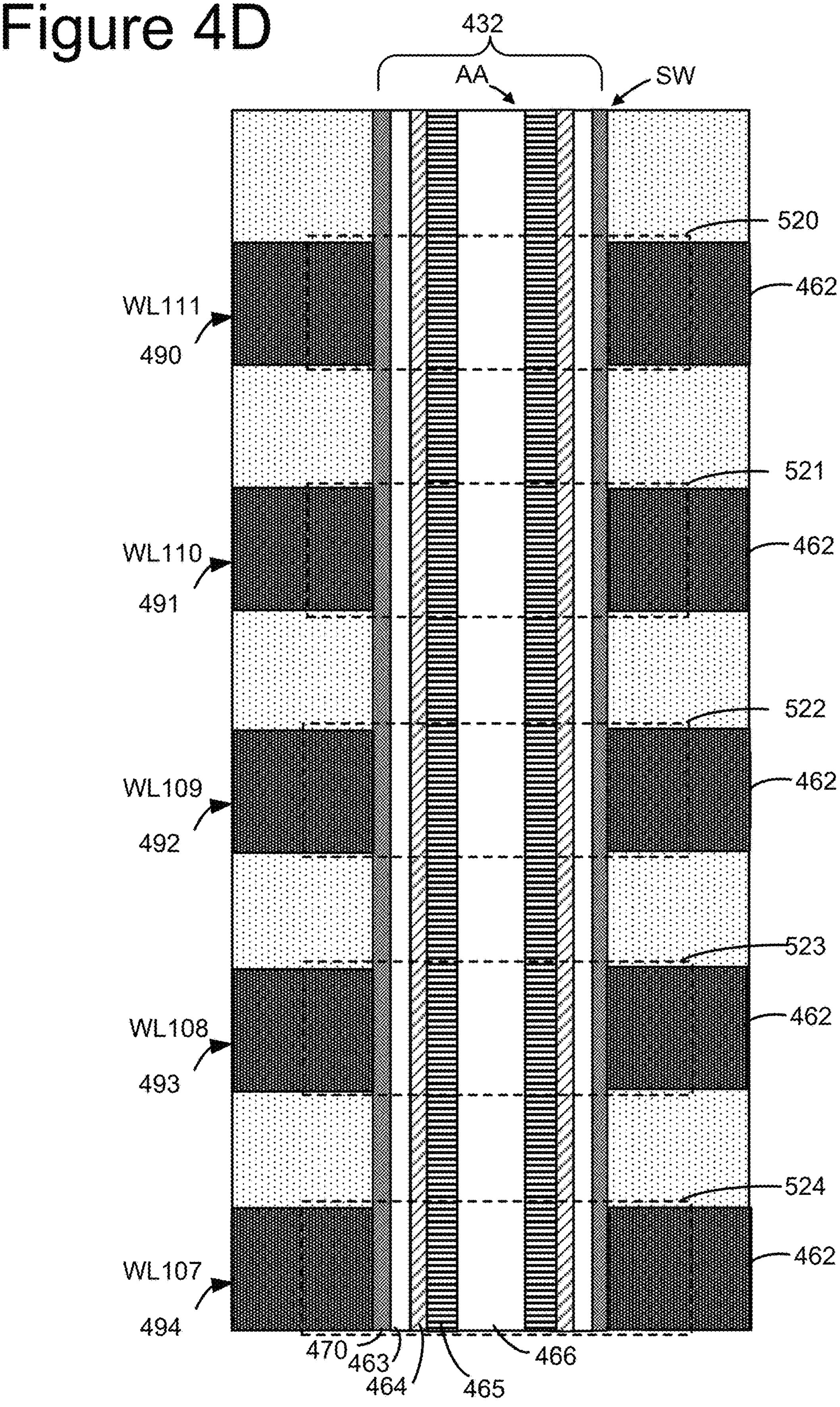
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
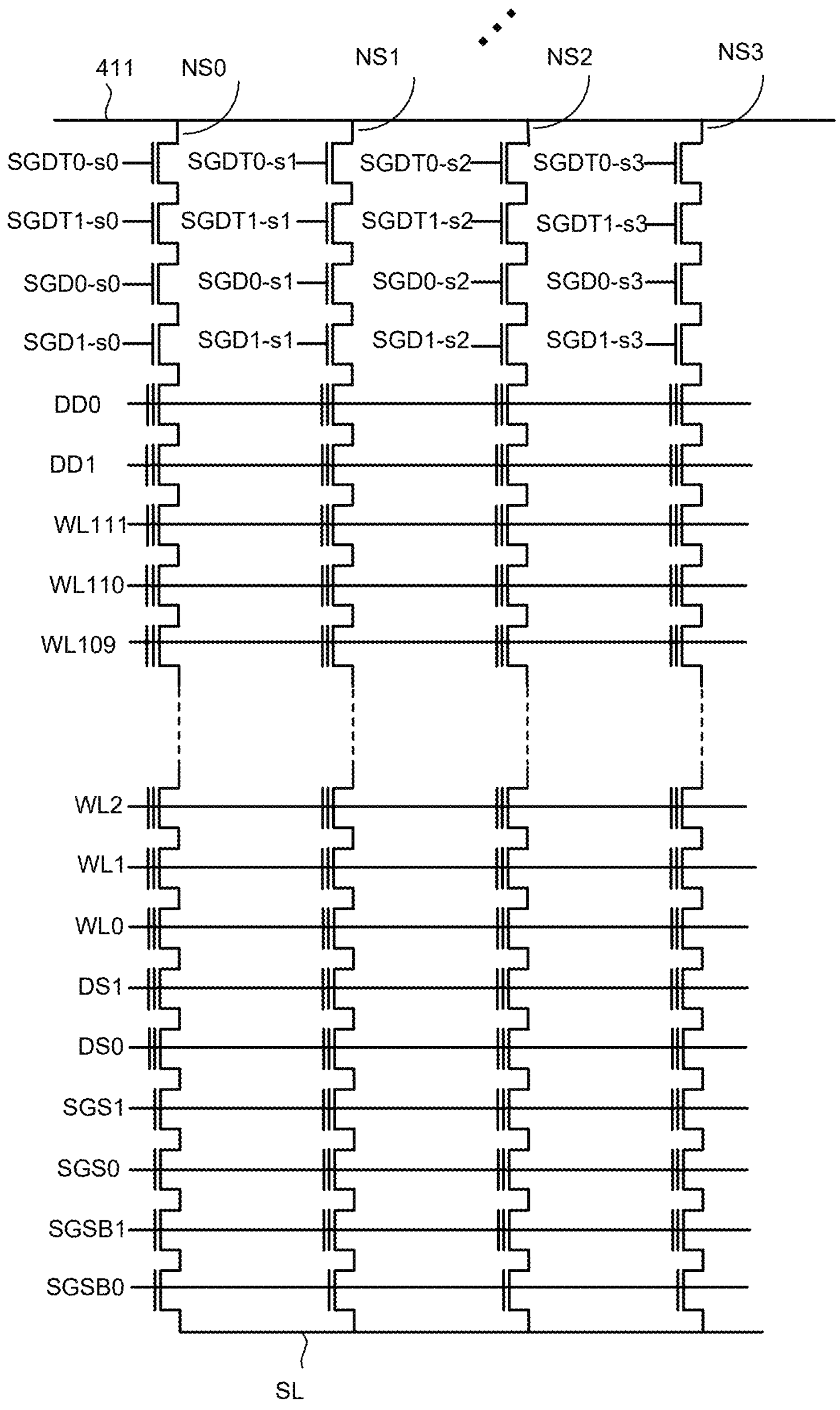
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "strings", as the term string has been defined herein. A first string corresponds to those vertical NAND strings controlled by SGDT0-*s*0, SGDT1-*s*0, SGD0-*s*0, and SGD1-*s*0. A second string corresponds to those vertical NAND strings controlled by SGDT0-*s*1, SGDT1-*s*1, SGD0-*s*1, and SGD1-*s*1. A third string corresponds to those vertical NAND strings controlled by SGDT0-*s*2, SGDT1-*s*2, SGD0-*s*2, and SGD1-*s*2. A fourth string corresponds to those vertical NAND strings controlled by SGDT0-*s*3, SGDT1-*s*3, SGD0-*s*3, and SGD1-*s*3. As noted, FIG. 4E only shows the NAND strings connected to bit line 411. However, a full schematic of the block would show every bit line and four vertical NAND strings connected to each bit line.

In one embodiment, all of the memory cells on the NAND strings in a physical block are erased as a unit. However in some embodiments, a physical block is operated as multiple sub-blocks, with each sub-block containing a contiguous set of word lines. For example, memory cells connected to WL0-WL55 may be in SB0 and memory cells connected to WL56-WL111 may be in SB1. In a sub-block mode, SB0 and SB1 may be erased separately. Hence, memory cells connected to WL0-WL55 may be in one erase unit and memory cells connected to WL56-WL111 may be in another erase unit. A physical block could be operated in more than two sub-blocks. Erase units can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5A:
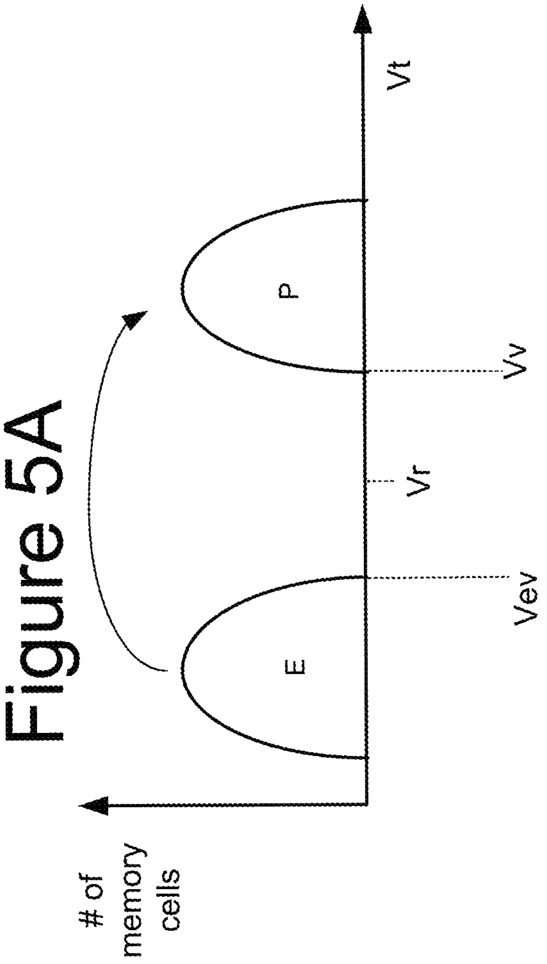
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cells is erased (state E) or programmed (state P). FIG. 5A also depicts program verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
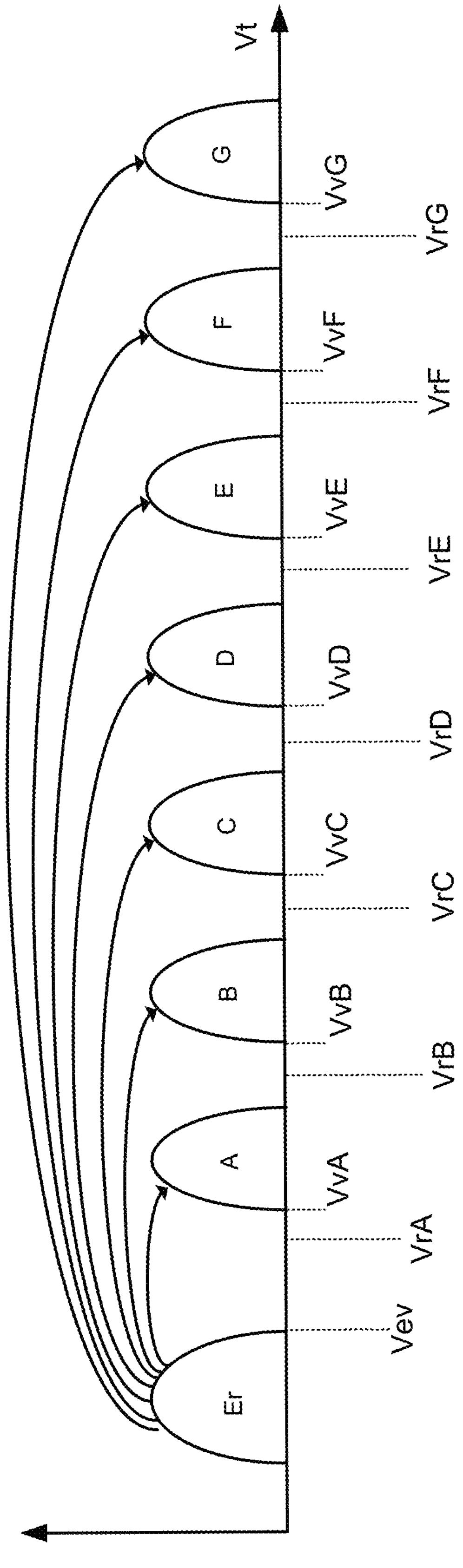

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

In an embodiment, the magnitude of the program verify reference voltage used in a selected sub-block of a selected block depends on the programmed status of memory cells in an unselected sub-block (or unselected sub-blocks) in the selected block. For example, in an SLC sub-block mode the magnitude of Vv depends on the programmed status of memory cells in the unselected sub-block(s) in order to compensate for back pattern effect. For example, in an MLC sub-block mode the magnitude of one or more of VvA, VvB, VvC, VvD, VvE, VvF, and/or VvG depends on the programmed status of memory cells in the unselected sub-block(s) in order to compensate for back pattern effect. In an embodiment, the magnitude of both the program verify reference voltage and the read reference voltage used in a selected sub-block of a selected block depends on the program status of memory cells in an unselected sub-block (or unselected sub-blocks) in the selected block. For example, in an SLC sub-block mode the magnitude of Vr depends on the programmed status of memory cells in the unselected sub-block(s) in order to compensate for back pattern effect. For example, in an MLC sub-block mode the magnitude of one or more of VrA, VrB, VrC, VrD, VrE, VrF, and/or VrG depends on the programmed status of memory cells in the unselected sub-block(s) in order to compensate for back pattern effect. Note that the magnitudes of these reference voltage depends on the present programmed status in the un-selected sub-block(s).

Figure 6:
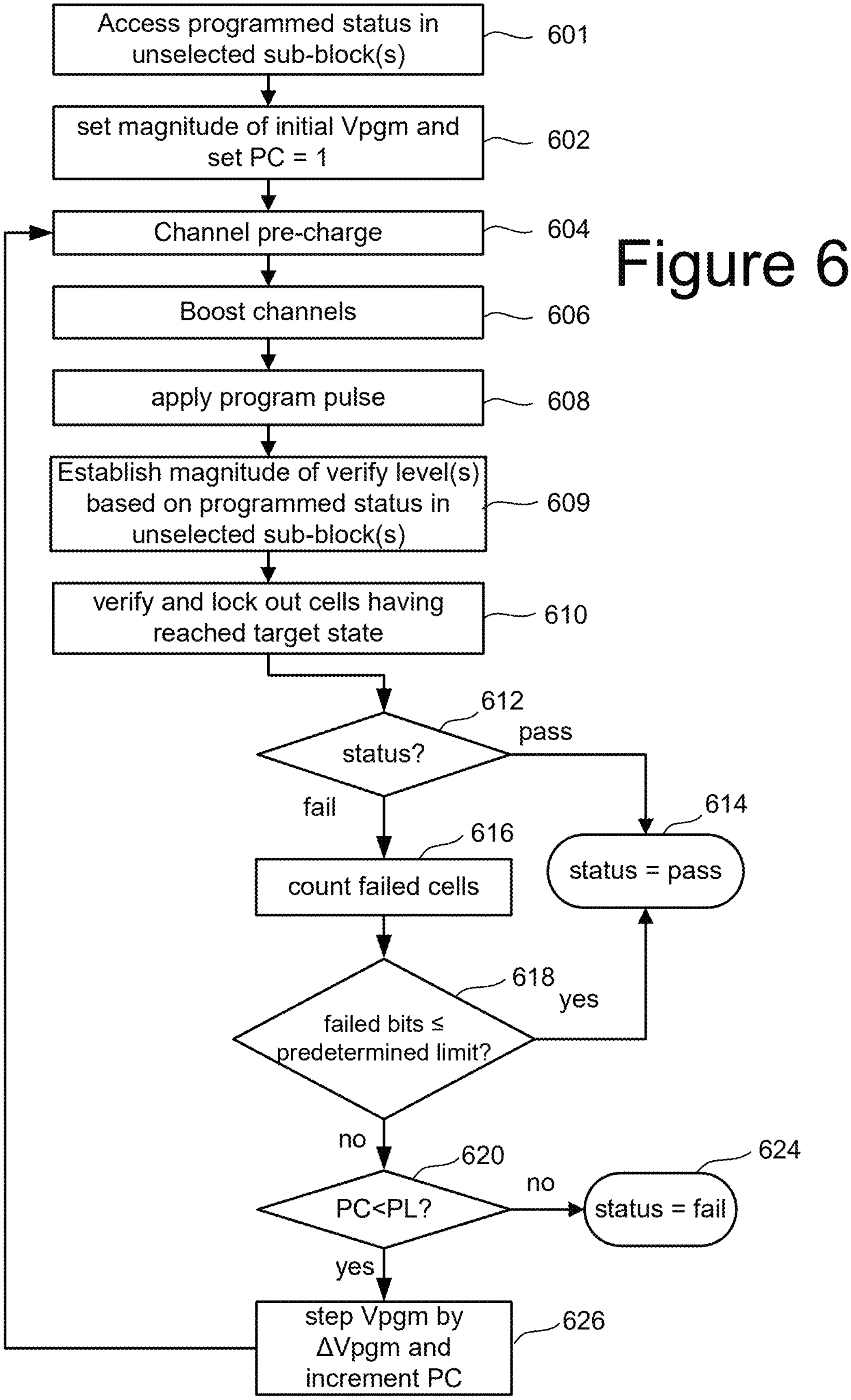
FIG. 6 is a flowchart describing one embodiment of a process for programming memory cells connected to a selected word line.

FIG. 6 is a flowchart describing one embodiment of a process for programming memory cells connected to a selected word line. Programming memory cells connected to a word line is referred to herein as programming the word line. For purposes of this document, the term program and programming are synonymous with write and writing. The process includes multiple loops, each of which includes a program phase and a verify phase. The process may be used in a sub-block mode to program memory cells connected to a selected word line in a selected sub-block. The unselected sub-blocks could be open (no word lines programmed), closed (all word lines programmed), or partially programmed (some but not all word lines programmed.) Further details of programming memory cells in a sub-block mode are described in U.S. Pat. No. 10,157,680, "Sub-Block Mode for Non-Volatile Memory", which is hereby incorporated by reference. Step 601 includes accessing the programmed status of the word lines in unselected sub-block(s) of the block that contains the selected sub-block (e.g., the sub-block having the word line selected for programming). The programmed status of a word line means whether the memory cells connected that word line are all in the erased state or whether the memory cells have undergone programming. In an embodiment, the memory controller 120 accesses the programmed status. In an embodiment, the memory controller 120 instructs the either the memory die 200 or the control die 211 to perform the remaining steps of the process. In one example embodiment, the remaining steps of the process in FIG. 6 are performed for memory structure 202 using the one or more control circuits (e.g., system control logic 260, column control circuitry 210, row control circuitry 220) discussed above.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the system will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, at least some unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In a sub-block mode embodiment, the magnitude of the verify reference levels depends on the programmed status of word lines in unselected sub-block(s) in order to compensate for a back pattern effect. Step 609 includes establishing the magnitude of the verify reference levels depending on the programmed status of word lines in unselected sub-block(s) in the selected block. In an embodiment, the memory controller structure 202 stores SBM sensing parameters 233, which may define the magnitude of the verify reference levels based on the programmed status. The memory controller 120 may send a code or the like to the die (200, 211) to indicate what the magnitude of the verify reference level(s) should be.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In some embodiments, the magnitude of the verify reference voltages will depend on whether programing will result in an open block. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Figure 7A:
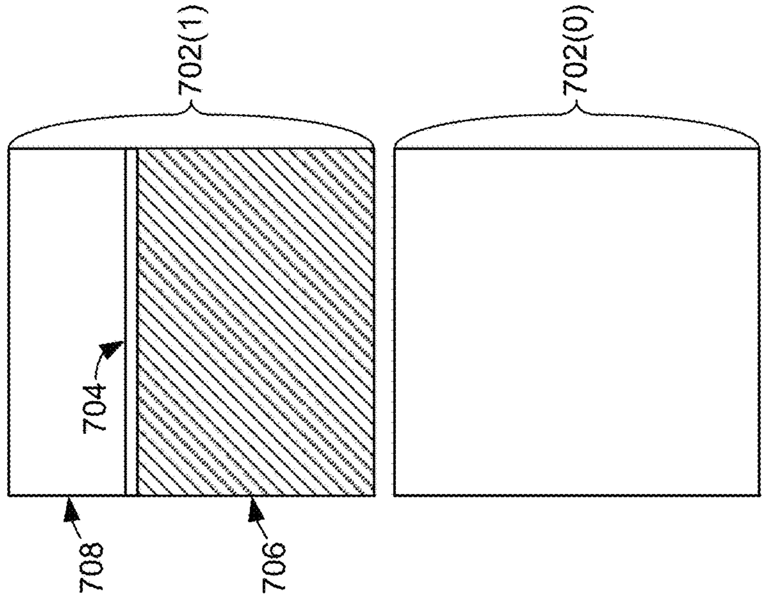
FIGS. 7A, 7B, and 7C depict three example cases of different programmed status in an unselected sub-block when programming a selected word line in a selected sub-block.
Figure 7B:
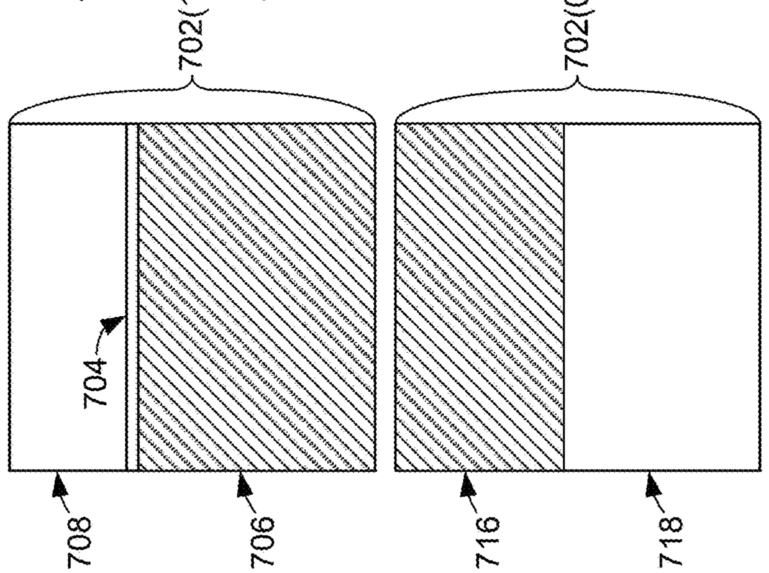
Figure 7C:
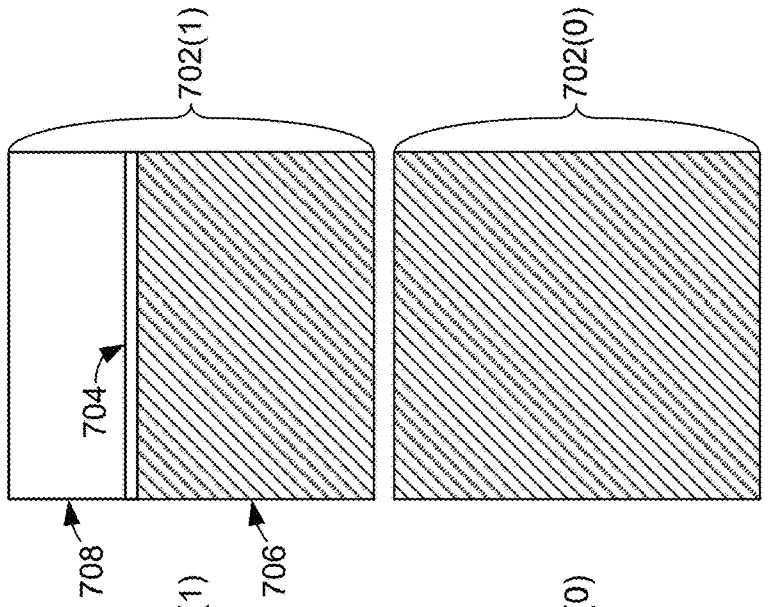

FIGS. 7A-7C depict three example cases of different programmed status in an unselected sub-block when programming a selected word line in a selected sub-block. In each example SB1 702(1) is selected for programming and SB0 702(0) is un-selected. In each case SB1 702(1) is partially programmed. The programmed word lines in SB1 are indicated by cross-hatched region 706. The unprogrammed word lines in SB1 are indicated by region 708. The selected word line 704 is undergoing programming. In FIG. 7A, SB0 702(0) is open (no word lines are programmed) when the selected word line 704 is programmed. Note that at a later point in time all word lines in SB1 may be programmed, which can significantly impact the Vt of the memory cells connected to the already programmed word line 704. In FIG. 7B, SB0 702(0) is partially programmed as indicated by programmed word lines 716 and unprogrammed word lines 718 when the selected word line 704 is programmed. Note that at a later point in time the unprogrammed word lines 718 in SB1 may be programmed, which can impact the Vt of the memory cells connected to the already programmed word line 704. In FIG. 7C, SB0 702(0) is closed (all word lines are programmed) when the selected word line 704 undergoes programming. This impact on the Vt of memory cells in SB1 due to later programming of the word lines un SB0 is referred to herein as the back pattern effect. These three cases will result in a different back pattern effect, which means that the sensing operation in the selected SB0 will be impacted differently for each case. Note that the examples could be reversed with SB0 having the selected word line undergoing programming and SB1 having different programmed conditions.

Figures 8, 9:
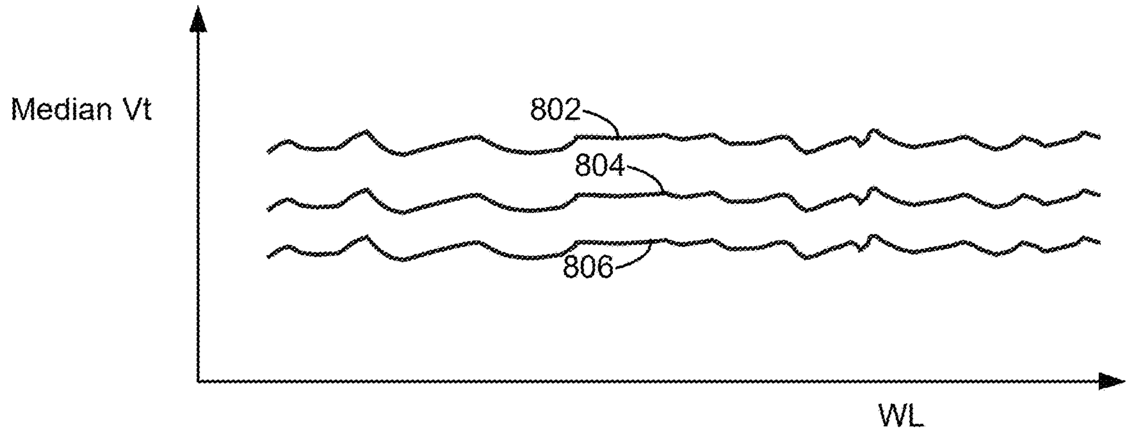
FIG. 8 is a graph depicts plots of memory cell threshold voltage (Vt) for the selected WL 704 for the three cases in FIGS. 7A-7C.
FIG. 9 is a table of verify and read levels for an embodiment of compensation for sub-block mode back pattern effect.

An example will now be discussed of the impact on the threshold voltage (Vt) of the memory cells on the selected WL 704 as programming progresses in the un-selected sub-block. FIG. 8 is a graph depicting plots of memory cell threshold voltage (Vt) for the selected WL 704 for the three cases in FIGS. 7A-7C. The x-axis is the WL number and the y-axis is the median Vt for memory cells on that word line. Each plot shows the Vt after programming has completed in the unselected SB0. Plot 802 corresponds to the example in FIG. 7A in which SB1 is open when the selected WL 704 undergoes programming. However, due to the later programming of the word lines in SB0 the apparent Vts of the memory cells on the selected WL 704 is raised significantly. Plot 804 corresponds to the example in FIG. 7B in which SB1 is partially programmed when the selected WL 704 undergoes programming. However, due to the later programming of some of the word lines in SB0 the apparent Vts of the memory cells on the selected WL 704 is raised somewhat. Plot 806 corresponds to the example in FIG. 7C in which SB1 is closed when the selected WL 704 undergoes programming. Therefore, the Vts of the of the memory cells on the selected WL 704 are not impacted.

FIG. 9 is a table of verify and read levels for an embodiment of compensation for sub-block mode back pattern effect. The table pertains to an example in which there are two sub-blocks. The sub-block that is the subject of programming or reading is referred to as the selected sub-block. The other sub-block(s) is/are referred to as the unselected sub-block(s). The table contains four example scenarios. Each scenario is based on whether the unselected sub-block is open or closed at the time of programming or reading in the selected sub-block. The table shows that a default verify reference voltage (Vv_def) may be used if the unselected block is open during program verify. An offset may be added to the default verify reference voltage (Vv_def+Vv_BPE) when the unselected block is closed during program verify. The table shows that a default read reference voltage (Vr_def) may be used with the unselected block is open during read. An offset may be added to the default read reference voltage (Ve_def+Vr_BPE) when the unselected block is closed during read.

Figure 10A:
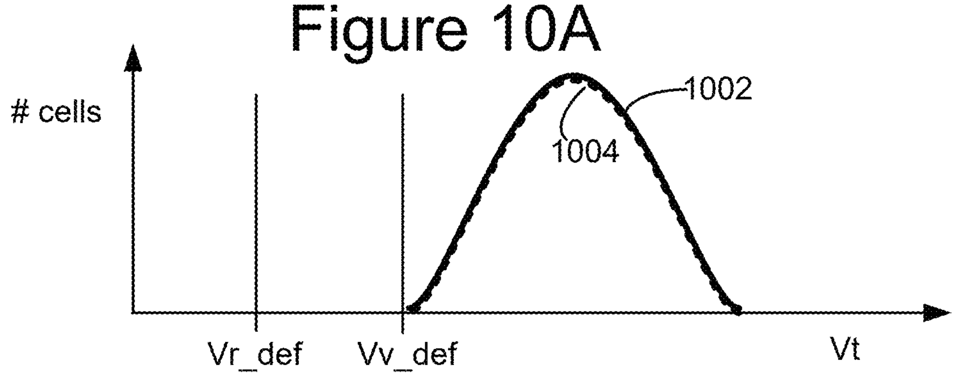
FIGS. 10A, 10B 10C, and 10D depict Vt distributions corresponding to the four scenarios in the table in FIG. 9.

FIGS. 10A-10D depict Vt distributions corresponding to the four scenarios in the table in FIG. 9. FIGS. 10A-10D also depict a verify reference level and a read reference level that may be used for the four scenarios. FIG. 10A corresponds to scenario 1 in FIG. 9 (open, open). A default verify level (Vv_def) may be used during program verify when the unselected block is open, resulting in verify Vt distribution 1002 (the solid line is Vt distribution 1002). A default read level (Vr_def) may be used during read when the unselected block is open. Since the unselected sub-block is still open during read there is not expected to be any shift in Vt distribution 1002. In other words, there is not expected to be a back pattern effect. Therefore, the default read level (Vr_def) works well to read Vt distribution 1004. Note that FIGS. 10A-10B discuss a Vt distribution for an example data state. However, there may be other data states to be read.

Figure 10B:
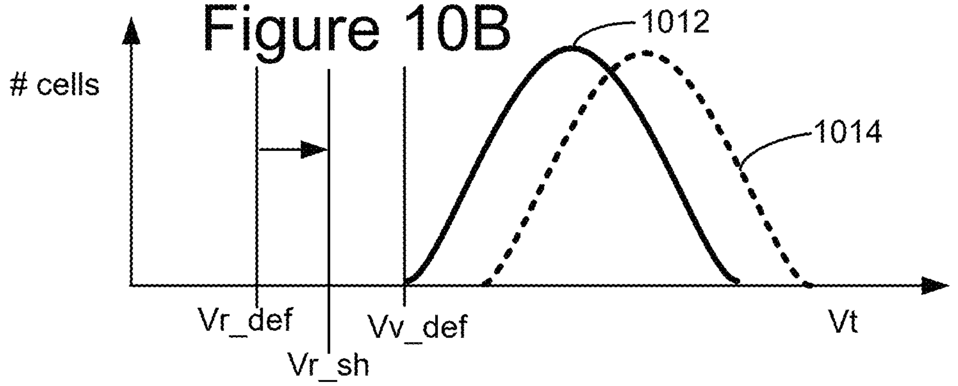

FIG. 10B corresponds to scenario 2 in FIG. 9 (open, closed). A default verify level (Vv_def) may be used during program verify when the unselected block is open, resulting in verify Vt distribution 1012. Because the memory cells are read after the unselected sub-block has been closed, there will be a significant back pattern effect. Read Vt distribution 1014 shows the shift in the Vts in the memory cells due to the back pattern effect. Thus, the read level is now shifted upwards (Vr_sh or Vr_def+Vr_BPE). Therefore, the upshifted read level (Vr_sh) works well to read Vt distribution 1014. Note that the default read level (Vr_def) is depicted in FIG. 10B for comparison purpose, but is not used. Also note that the voltage gap between the read level and the verify level is smaller in FIG. 10B than in FIG. 10A.

Figure 10C:
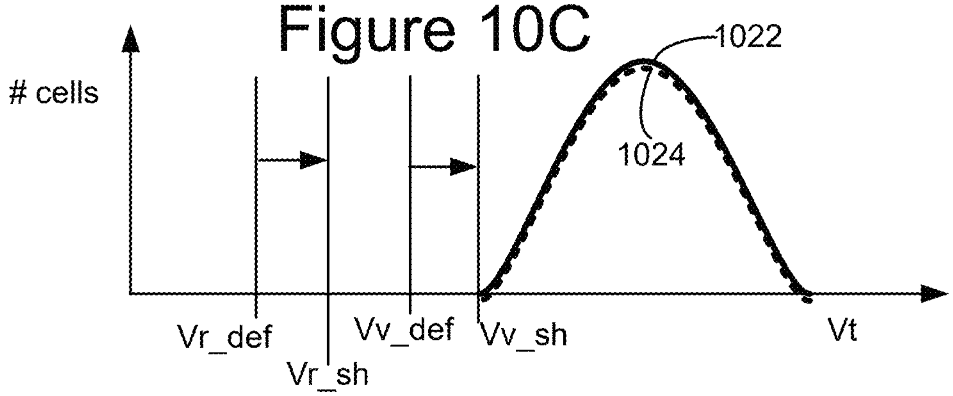

FIG. 10C corresponds to scenario 3 in FIG. 9 (closed, closed). An upshifted verify level (Vv_sh or Vv_def+Vv_BPE) may be used during program verify when the unselected block is closed, resulting in verify Vt distribution 1022. Because the memory cells are read after the unselected sub-block is still closed, there is not expected to be a significant change to the Vts at the time the cells are read (relative to program verify). Read Vt distribution 1024 shows that the Vts in the memory cells has not changed significantly since programming with the closed sub-block. However, due to the upshifted program verify Vt distribution 1022, the read level is shifted upwards (Vr_sh or Vr_def+Vr_BPE). Therefore, the upshifted read level (Vr_sh) works well to read Vt distribution 1024. Note that the default levels (Vr_def, Vv_def) are not used for the case depicted in FIG. 10C, but are depicted for comparison.

Figure 10D:
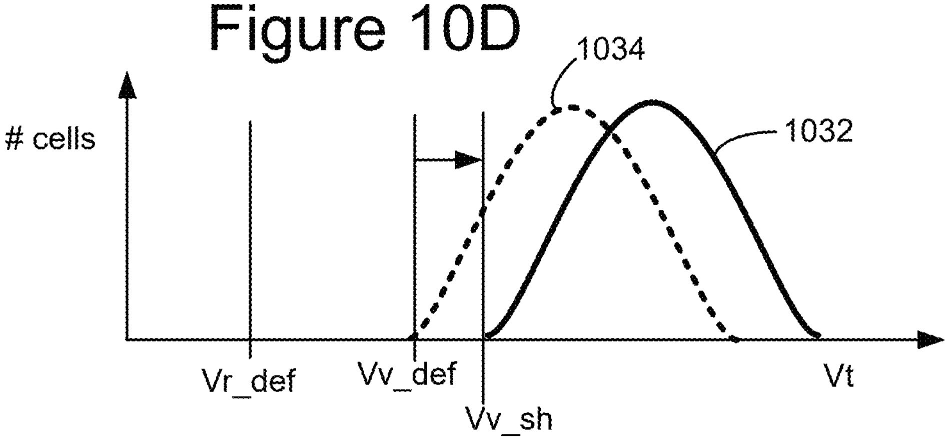

FIG. 10D corresponds to scenario 4 in FIG. 9 (closed, open). An upshifted verify level (Vv_sh or Vv_def+Vv_BPE) may be used during program verify when the unselected block is closed, resulting in verify Vt distribution 1032. Because the memory cells are read after the unselected sub-block is open, there may be a significant drop in the Vts at the time the cells are read. Read Vt distribution 1034 shows that the Vts in the memory cells have dropped significantly since programming with the closed sub-block. Therefore, the default read level (Vr_def) is used. The default read level (Vr_def) works well to read Vt distribution 1034. Also note that the voltage gap between the read level and the verify level is larger in FIG. 10D than in FIG. 10A. Note that the default verify level (Vv_def) is not used for the case depicted in FIG. 10D, but is depicted for comparison.

In the example in FIG. 9, the magnitude of the verify reference voltage depends on the open/closed status of the unselected sub-block(s) at the time of program verify and the magnitude of the read reference voltage depends on the open/closed status of the unselected sub-block at the time of read. In an embodiment, the magnitude of the verify reference voltage depends on the programmed status of the word lines in one or more unselected sub-blocks at the time of program verify and the magnitude of the read reference voltage depends on the programmed status of the word lines in the one or more unselected sub-blocks at the time of read. FIG. 11 is a table of verify and read levels for an embodiment of compensation for sub-block mode back pattern effect in which the verify and read levels depend on the programmed status of the word lines in the one or more unselected sub-blocks at the time of program verify and read respectively. The table pertains to an example in which the programmed status of word lines in the unselected block(s) is divided into four cases that are based on the percentage of programmed word lines (PWLs). The table shows that a default verify reference voltage (Vv_def) and a default read reference voltage (Vr_def) may be used for Case 1. A first offset (Vv_BPE1) may be added to the default verify reference voltage for Case 2. A second offset (Vv_BPE2) may be added to the default verify reference voltage for Case 3. A third offset (Vv_BPE3) may be added to the default verify reference voltage for Case 4. In an embodiment, Vv_BPE1<Vv_BPE2<Vv_BPE3. Also each of Vv_BPE1, Vv_BPE2, and Vv_BPE3 are positive voltages. A first offset (Vr_BPE1) may be added to the default read reference voltage for Case 2. A second offset (Vr_BPE2) may be added to the default read reference voltage for Case 3. A third offset (Vr_BPE3) may be added to the default read reference voltage for Case 4. In an embodiment, Vr_BPE1<Vr_BPE2<Vr_BPE3. Also each of Vr_BPE1, Vv_BPE2, and Vv_BPE3 are positive voltages. Note that the table in FIG. 11 may be modified to cover more or fewer than four cases, wherein the ranges in PWLs may differ from the examples in FIG. 11.

Figure 12:
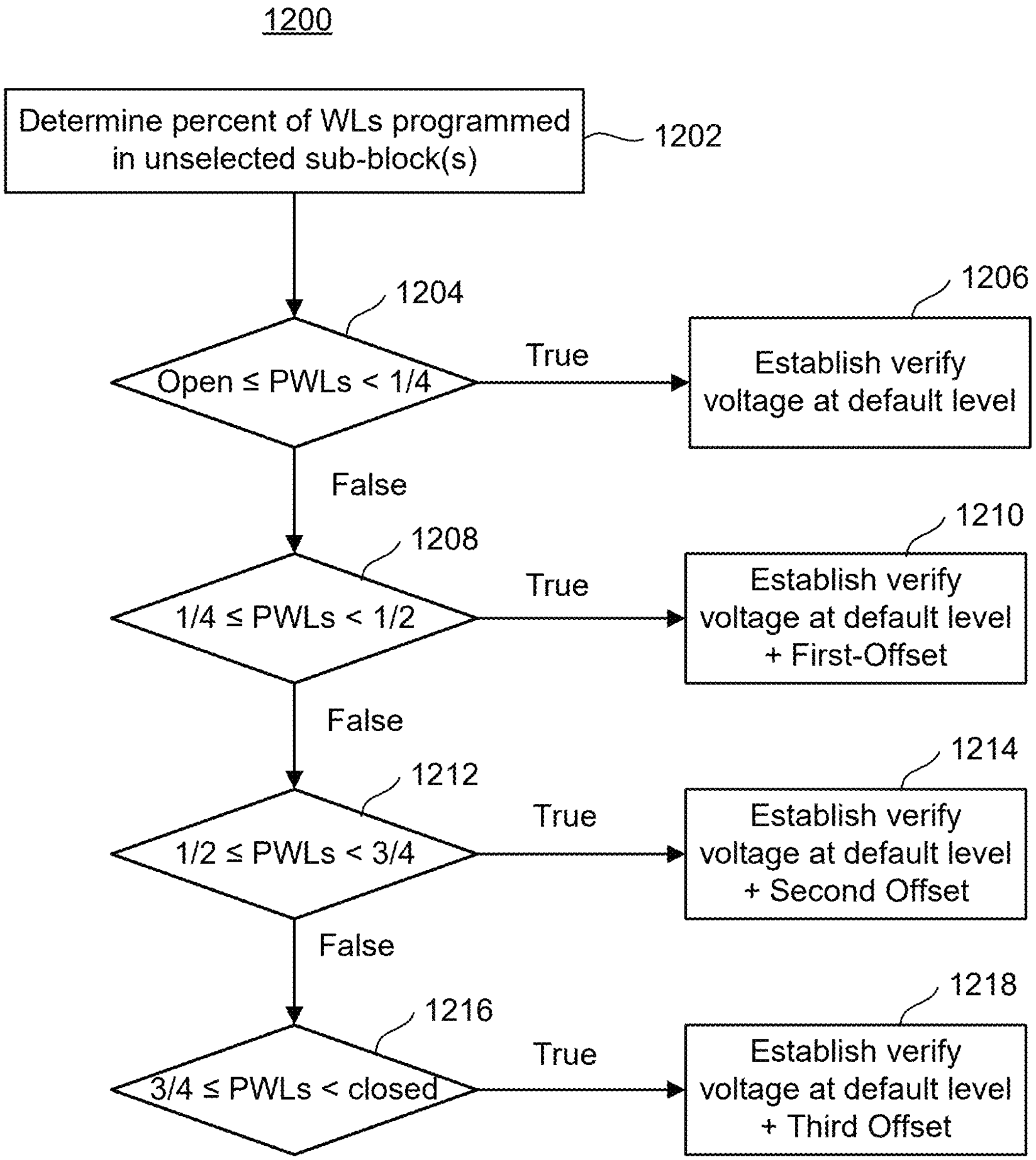
FIG. 12 is a flowchart of a process of an embodiment of establishing a magnitude for a program verify voltage for back pattern effect in an SBM.

FIG. 12 is a flowchart of a process 1200 of an embodiment of establishing a magnitude for a program verify voltage for back pattern effect in an SBM. The process 1200 is consistent with the examples in the table in FIG. 11. The process 1200 may be performed by a combination of the memory controller 120 and/or control circuitry on the die (200, 211). Step 1202 includes determining a percent of word lines programmed in unselected sub-blocks. In an embodiment, the memory controller 120 maintains data that indicates the programming status of each word line. In an embodiment, one or more word lines in a sub-block may be read to determine the programming status. Word lines in a sub-block are typically programmed in a certain order, wherein strategic reading of word lines may be used to limit the number of word lines that need to be read.

Step 1204 is a determination of whether the percentage of programmed word lines (PWL) is less than ¼. If this is true, then in step 1206 the verify voltage is established at a default level. The establishing of the verify voltage may be performed by system control logic 260 on the die (200, 211). The memory controller 120 may send a code or the like to the system control logic 260 to indicate what value should be selected from SBM sensing parameters 233.

Step 1208 is a determination of whether the percentage of programmed word lines (PWL) is equal or greater than ¼ but less than ½. If this is true, then in step 1210 the verify voltage is established at the default level plus a first offset (e.g., Vvdef+Vv_BPE1). The establishing of the verify voltage may be performed by system control logic 260 on the die (200, 211). The memory controller 120 may send a code or the like to the system control logic 260 to indicate what value should be selected from SBM sensing parameters 233.

Step 1212 is a determination of whether the percentage of programmed word lines (PWL) is equal or greater than ½ but less than ¾ If this is true, then in step 1214 the verify voltage is established at the default level plus a second offset (e.g., Vvdef+Vv_BPE2). The establishing of the verify voltage may be performed by system control logic 260 on the die (200, 211). The memory controller 120 may send a code or the like to the system control logic 260 to indicate what value should be selected from SBM sensing parameters 233.

Step 1216 is a determination of whether the percentage of programmed word lines (PWL) is equal or greater than ¾. If this is true, then in step 1218 the verify voltage is established at the default level plus a third offset (e.g., Vvdef+Vv_BPE3). The establishing of the verify voltage may be performed by system control logic 260 on the die (200, 211). The memory controller 120 may send a code or the like to the system control logic 260 to indicate what value should be selected from SBM sensing parameters 233.

Process 1200 may be modified for an embodiment of establishing a magnitude for a read reference voltage for back pattern effect in an SBM. Note that this modification for read may be used in combination with process 1200 for verify. Thus, a sub-block that was program verified using the parameters in the table in FIG. 11 may later be read using the parameters in the table in FIG. 11. As noted above, the table in FIG. 11 may be modified to cover more or fewer than four cases, wherein the ranges in PWLs may differ from the examples in FIG. 11.

Figure 13:
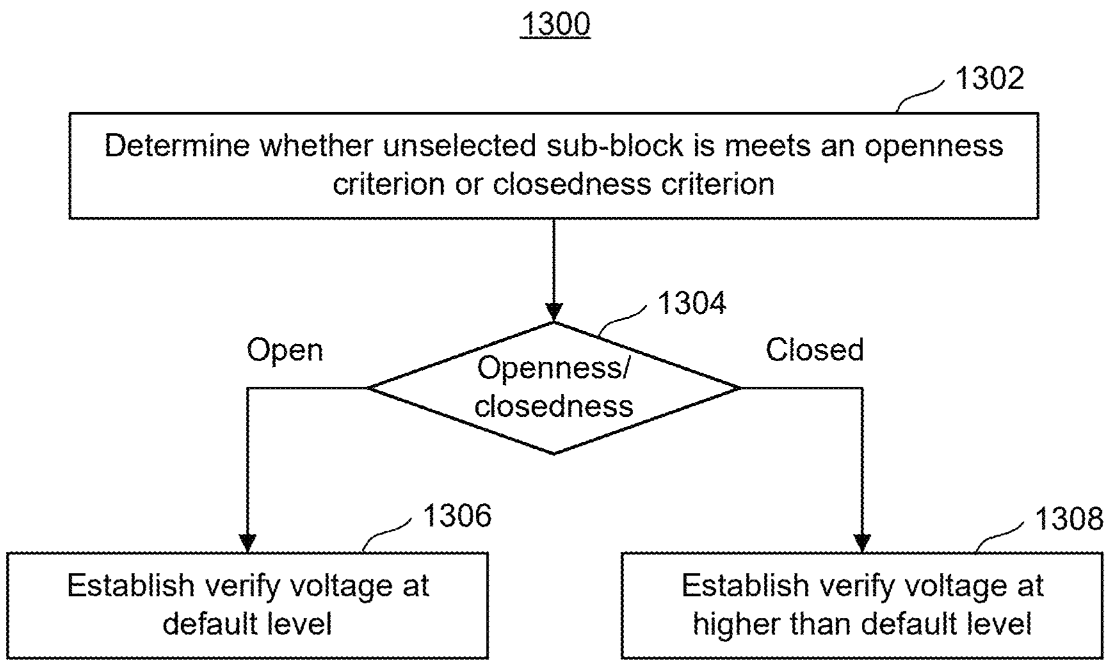
FIG. 13 is a flowchart of a process of an embodiment of establishing a magnitude for a program verify voltage for back pattern effect in an SBM.

FIG. 13 is a flowchart of a process 1300 of an embodiment of establishing a magnitude for a program verify voltage for back pattern effect in an SBM. The process 1300 is consistent with the examples in the table in FIG. 9. Step 1302 includes determining whether an unselected sub-block meets an openness criterion or a closedness criterion. In an embodiment, the openness criterion is whether fewer than a first percentage of word lines are programmed. In an embodiment, the closedness criterion is whether more than a second percentage of word lines are programmed. The second percentage is at least as great as the first percentage. In an embodiment, the openness criterion is whether fewer than a first number of word lines are programmed. In an embodiment, the closedness criterion is whether more than a second number of word lines are programmed. The second number is at least as many as the first number. In an embodiment, the memory controller 120 maintains data that indicates whether a sub-block is open or closed. In an embodiment, one or more word lines in a sub-block may be read to determine whether a sub-block is open or closed. In an embodiment, a partially programmed sub-block may be categorized as meeting either the openness criterion or the closedness criterion depending on the number or percentage of programmed word lines.

Step 1304 is a branch of whether the unselected sub-block meets the openness criterion or alternatively meets the closedness criterion. If the unselected sub-block meets the openness criterion (e.g., open) then in step 1306 the verify voltage is established at a default level (e.g., Vv_def). If the unselected sub-block meets the closedness criterion (e.g., closed) then in step 1308 the verify voltage is established at an offset to the default level (e.g., Vv_def+Vv_BPE). The establishing of the verify voltage may be performed by system control logic 260 on the die (200, 211). The memory controller 120 may send a code or the like to the system control logic 260 to indicate what value should be selected from SBM sensing parameters 233.

Process 1300 may be modified for an embodiment of establishing a magnitude for a read reference voltage for back pattern effect in an SBM. Note that this modification for read may be used in combination with process 1300 for verify. Thus, a sub-block that was program verified using the parameters in the table in FIG. 9 may later be read using the parameters in the table in FIG. 9.

Figure 14:
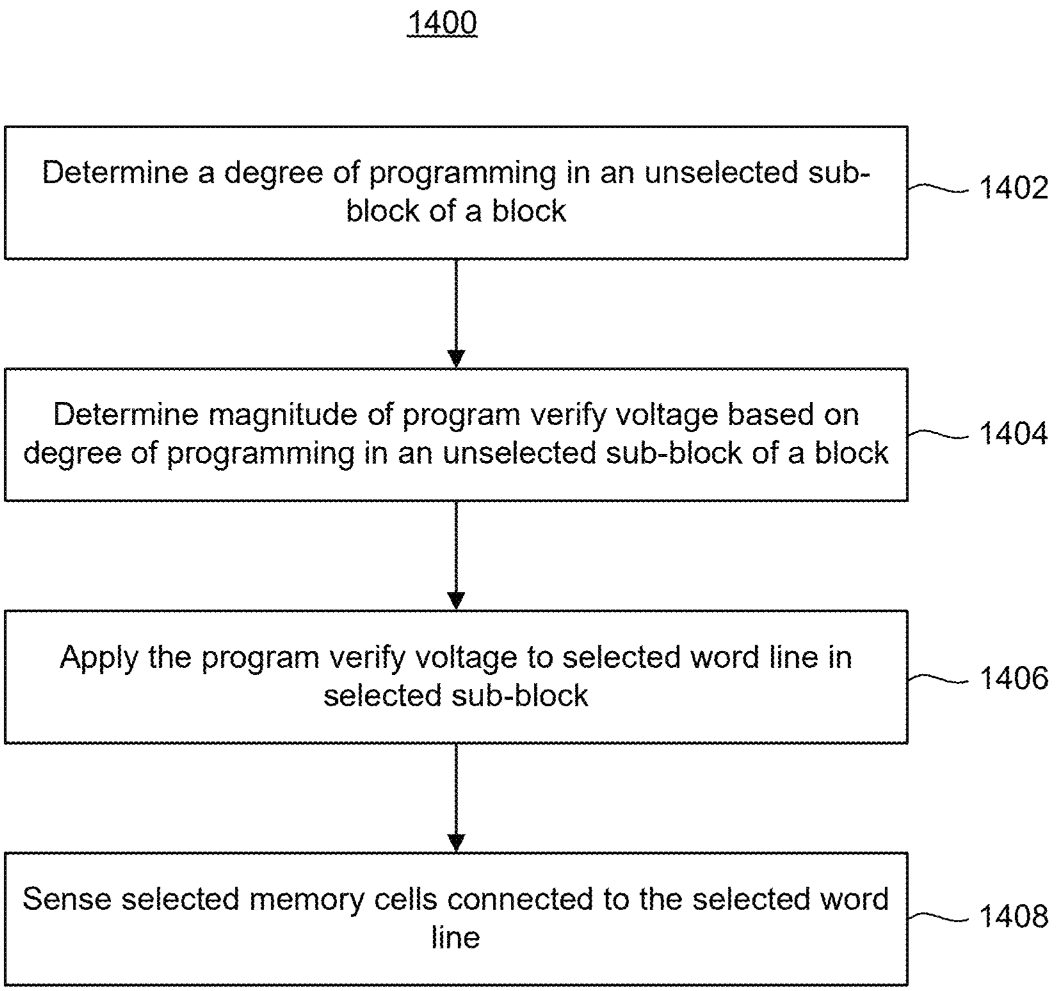
FIG. 14 is a flowchart of a process of an embodiment of establishing a magnitude for a program verify voltage for back pattern effect in an SBM.

FIG. 14 is a flowchart of a process 1400 of an embodiment of establishing a magnitude for a program verify voltage for back pattern effect in an SBM. Step 1402 includes determining a degree of programming in unselected sub-blocks. In an embodiment, the degree of programming in unselected sub-blocks includes whether the unselected sub-block(s) meet an openness criterion or alternatively meet a closedness criterion. In an embodiment, the degree of programming in unselected sub-blocks includes whether the unselected sub-block(s) are open/closed. In an embodiment, the degree of programming in unselected sub-blocks includes the percentage of programmed word lines. Step 1404 includes determining a magnitude of a program verify voltage based on the degree of programming in unselected sub-blocks. In an embodiment, the magnitude of the program verify voltage increases with a greater degree of programming in the unselected sub-blocks. Step 1406 includes applying the program verify voltage to the selected word line in the selected sub-block. Step 1408 includes sensing selected memory cells connected to the selected word line in response to the verify voltage.

Process 1400 may be modified for an embodiment of establishing a magnitude for a read reference voltage for back pattern effect in an SBM. Note that this modification for read may be used in combination with process 1400 for verify. Thus, a sub-block that was program verified using process 1400 may later be read using a read reference voltage that has a magnitude that depends on the degree of programming in unselected sub-blocks at the time of read.

Figure 15:
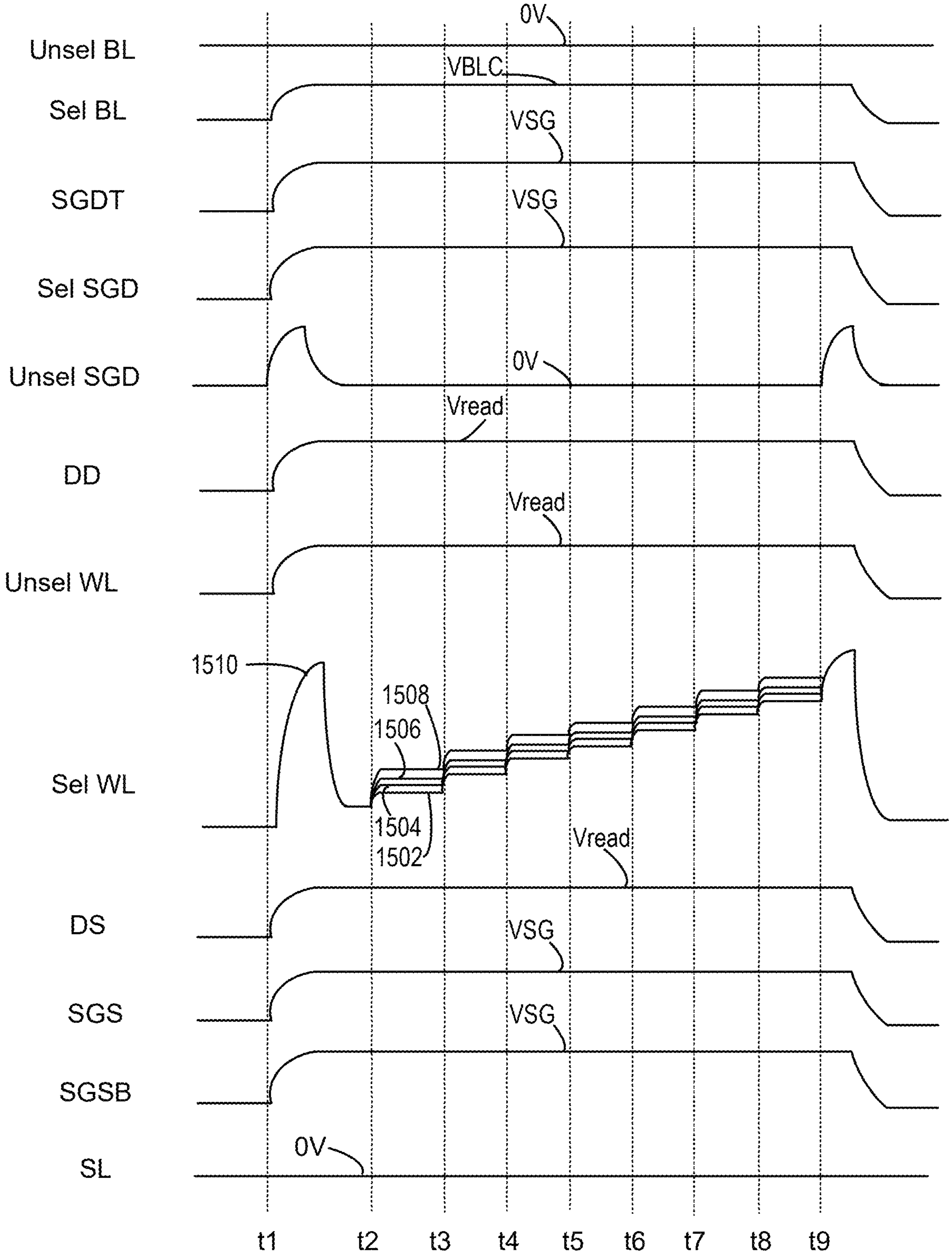
FIG. 15 is a diagram depicting timing of voltages that are applied to control lines during an embodiment of SBM back pattern effect compensation.

FIG. 15 is a diagram depicting timing of voltages that are applied to control lines during an embodiment of SBM back pattern effect compensation. In an embodiment, the voltages are applied during program verify. In an embodiment, the voltages are applied during read. FIG. 15 provides an example for sensing MLC with 3 bits cell. Examples of the control lines referenced in FIG. 15 are depicted in FIGS. 4C and 4E. Note that the bit lines extend over the selected block, whereas the select lines (SGD, SGD) and word lines (dummy word lines and data word lines) reside in the selected block. The unselected bit lines (BL) refer to those that do not need to be sensed. During the verify phase of some of the program loops, some of the memory cells need not be sensed. For example, bit lines associated with cells that have already passed program verify may be locked out from sensing to save power. The unselected BLs may be held at 0V. The selected BLs are raised to a sensing voltage (VBLC) at t1. An example of VBLC is about 0.3V. At t1 a number of the control lines (SGDT, selected SGD, SGS, and SGDB) are raised to VSG. An example of VSG is about 6.5V. The selected SGD refers to the SGD for the string that is selected. The unselected SGD refers to all other SGD in the block. The unselected SGD may receive a "spike voltage" at t1. The unselected SGD are returned to 0V during the sensing operations, which occur between t2 and t9. The unselected SGD may receive another "spike voltage" at t9. At t1, unselected word lines and dummy word lines (DD, DS) receive a read pass voltage (Vread). An example of Vread is about 6.5V. Vread is a pass voltage that serves as an over-drive voltage that is greater than the highest Vt of any of the cells in the block. The source line (SL) may be held at 0V.

At t1 the selected WL receives a spike voltage 1510. After the spike voltage 1510, the selected WL is raised to the A reference level at t2. The four plots 1502, 1504, 1506, 1508 between t2 and t3 refer to four different options such as in the table in FIG. 11. For example, plot 1502 may be the default level, plot 1504 may add a first offset to the default level, plot 1506 may add a second offset to the default level, and plot 1508 may add a fourth offset to the default level. In general, there are at least two different sensing levels, as in the example table in FIG. 9. At t3 the selected WL is raised to the B reference level. At t4 the selected WL is raised to the C reference level. At t5 the selected WL is raised to the D reference level. At t6 the selected WL is raised to the E reference level. At t7 the selected WL is raised to the F reference level. At t8 the selected WL is raised to the G reference level. At t9, the selected WL receives another spike voltage.

In view of the foregoing, an embodiment includes an apparatus comprising a communication interface configured to receive memory commands for accessing a three-dimensional memory structure having blocks. Each block has NAND strings and word lines connected to the NAND strings. The apparatus comprises one or more control circuits coupled to the communication interface. The one or more control circuits are configured to connect to the three-dimensional memory structure. The one or more control circuits are configured to determine a magnitude for a program verify voltage for a selected word line in a selected sub-block in a selected block. The magnitude for the program verify voltage depends on a programmed status of the word lines in one or more unselected sub-blocks in the selected block when the program verify voltage applied to the selected word line. The one or more control circuits are configured to apply the program verify voltage having the magnitude that depends on the programmed status of the word lines in the one or more unselected sub-blocks to the selected word line. The one or more control circuits are configured to sense selected memory cells connected to the selected word line in response to application of the program verify voltage.

In a further embodiment, the one or more control circuits are further configured to establish the program verify voltage to have a first magnitude responsive to a percentage of unprogrammed word lines in the one or more unselected sub-blocks being below a first percentage. And the one or more control circuits are further configured to establish the program verify voltage to have a second magnitude responsive to the percentage of unprogrammed word lines in the one or more unselected sub-blocks being above a second percentage that is at least as high as the first percentage. The second magnitude is greater than the first magnitude.

In a further embodiment, the one or more control circuits are further configured to establish the program verify voltage to have a first magnitude responsive to the one or more unselected sub-blocks being open when the program verify voltage is to be applied to the selected word line. And the one or more control circuits are further configured to establish the program verify voltage to have a second magnitude responsive to the one or more unselected sub-blocks being closed when the program verify voltage is to be applied to the selected word line. The second magnitude being less than the first magnitude.

In a further embodiment, the one or more control circuits are further configured to apply a default voltage gap between the program verify voltage and a read reference voltage during the sub-block mode when the programmed status of the memory cells in the one or more unselected sub-blocks in the selected block is the same during program verify and read of the selected word line, the verify voltage for verifying a first data state, the read reference voltage for reading the first data state. And the one or more control circuits are further configured to apply other than the default voltage gap between the program verify voltage and the read reference voltage during the sub-block mode when the programmed status of the one or more unselected sub-blocks in the selected block is different during read of the selected word line than program verify of the selected word line.

In a further embodiment, the one or more control circuits are further configured to apply a smaller voltage gap than the default voltage gap between the program verify voltage and the read reference voltage when more word lines are programmed in the one or more unselected sub-blocks in the selected block during read than during program verify of the selected word line.

In a further embodiment, the one or more control circuits are further configured to apply a larger voltage gap than the default voltage gap between the program verify voltage and the read reference voltage when fewer word lines are programmed in the one or more unselected sub-blocks in the selected block during read than during program verify of the selected word line.

In a further embodiment, the one or more control circuits are further configured to: select the selected word line for read after the selected memory cells have been programmed verified for a first data state based on the program verify voltage having the magnitude that depended on the programmed status of the word lines in the one or more unselected sub-blocks in the selected block; determine a magnitude for a read reference voltage for the selected word line in the selected sub-block in the selected block, the magnitude for the read reference voltage depends on a programmed status of the word lines in the one or more unselected sub-blocks in the selected block when the read reference voltage applied to the selected word line; apply the read reference voltage having the magnitude that depends on the programmed status of the word lines in the one or more unselected sub-blocks to the selected word line during the sub-block mode; and determine whether selected memory cells connected to the selected word line have a threshold voltage of at least the first data state in response to application of the read reference voltage.

In a further embodiment, the one or more control circuits are further configured to establish the read reference voltage to have a first magnitude responsive to the one or more unselected sub-blocks being open when the read reference voltage is to be applied to the selected word line. And the one or more control circuits are further configured to establish the read reference voltage to have a second magnitude responsive to the one or more unselected sub-blocks being closed when the read reference voltage is to be applied to the selected word line, the second magnitude being greater than the first magnitude.

In a further embodiment, the one or more control circuits are further configured to establish the read reference voltage to have a first magnitude responsive to a number of unprogrammed word lines in the one or more unselected sub-blocks being below a particular percentage when the read reference voltage is to be applied to the selected word line. And the one or more control circuits are further configured to establish the read reference voltage to have a second magnitude responsive to the number of unprogrammed word lines in the one or more unselected sub-blocks being above the particular percentage when the read reference voltage is to be applied to the selected word line, the second magnitude being greater than the first magnitude.

In a further embodiment, the selected block comprises a first sub-block containing a first set of contiguous word lines including the selected word line, the first sub-block being the selected sub-block; the selected block comprises a second sub-block containing a second set of contiguous word lines, the second sub-block being an unselected sub-block of the one or more unselected sub-blocks; and the one or more control circuits are further configured to: establish the verify voltage to have a first magnitude responsive to the second sub-block having less than or equal to a first percentage of word lines programmed when applying the verify voltage to the selected word line; establish the verify voltage to have a second magnitude responsive to the second sub-block more than the first percentage of word lines programmed but less than or equal to a second percentage of word lines programmed when applying the verify voltage to the selected word line; and establish the verify voltage to have a third magnitude responsive to the second sub-block more than the second percentage of word lines programmed but less than or equal to a third percentage of word lines programmed when applying the verify voltage to the selected word line. The first percentage less than the second percentage. The second percentage less than the third percentage. The first magnitude is less than the second magnitude. The second magnitude is less than the third magnitude.

In a further embodiment, the selected block comprises a first sub-block containing a first set of contiguous word lines including the selected word line, the first sub-block being the selected sub-block; the selected block comprises a second sub-block containing a second set of contiguous word lines, the second sub-block being an unselected sub-block; the selected block comprises a third sub-block containing a third set of contiguous word lines, the third sub-block being an unselected sub-block. The one or more control circuits are further configured to: establish the verify voltage to have a first magnitude responsive the word line programmed state in the second sub-block and the third sub-block meeting a first fullness criterion; and establish the verify voltage to have a second magnitude responsive the word line programmed state in the second sub-block and the third sub-block meeting a second fullness criterion, the second fullness criterion having more word lines programmed than the first fullness criterion, the second magnitude being greater than the first magnitude.

An embodiment includes a method for operating a memory system. The method comprises determining a degree of programming in an unselected sub-block of a block. The block has a plurality of NAND strings and word lines, the block comprising the unselected sub-block and a selected sub-block. The selected sub-block has a first set of contiguous word lines. The unselected sub-block has a second set of contiguous word lines. The method comprises applying a program verify voltage to a selected word line in the selected sub-block having a magnitude that depends on the degree of programming in the unselected sub-block. The selected word line connected to selected memory cells. The method comprises determining results of verifying the selected memory cells in response to application of the program verify voltage.

In an embodiment, the method further comprises determining a degree of programming in the unselected sub-block of the block prior to a read while the selected memory cells on the selected word still store the data verified with the program verify voltage having the magnitude that depended on the degree of programming in the unselected sub-block at a time of program verify, the program verify voltage being used to verify a first data state; applying a read reference voltage to the selected word line having a magnitude that depends on the degree of programming in the unselected sub-block when applying the read reference voltage to the selected word line, the read reference voltage being used to read the first data state; and sensing the selected memory cells in response to application of the read reference voltage.

An embodiment includes a non-volatile storage system. The system comprises a three-dimensional memory structure having a plurality of blocks. Each block comprises NAND strings and data word lines connected to the NAND strings. Each block has multiple sub-blocks that each contain a contiguous set of the data word lines of the block. The non-volatile storage system further comprises means for determining a magnitude of a program verify voltage based on a programmed completeness in one or more unselected sub-blocks of a selected block. The non-volatile storage system further comprises means for verifying selected memory cells in a selected sub-block in the selected block based on the program verify voltage when the one or more unselected sub-blocks of the selected block have the determined programmed completeness.

In an embodiment, the means for determining a magnitude of a program verify voltage based on the programmed completeness in one or more unselected sub-blocks of a selected block comprises one or more of memory controller 120, SBM back effect compensation circuitry 157, system control logic 260, state machine 262, processor 156, an FPGA, an ASIC, and/or and integrated circuit. In an embodiment the means for determining a magnitude of a program verify voltage based on the programmed completeness in one or more unselected sub-blocks of a selected block performs one or more of process 1200 (see FIG. 12), process 1300 (see FIG. 13), and/or steps 1402 and 1404 of process 1400 (see FIG. 14).

In an embodiment, the means for verifying selected memory cells in a selected sub-block in the selected block based on the program verify voltage when the one or more unselected sub-blocks of the selected block have the determined programmed completeness comprises one or more of system control logic 260, row control circuitry 220, column control circuitry 210, a sense amplifier, a processor, an FPGA, an ASIC, and/or and integrated circuit. In an embodiment the means for verifying selected memory cells in a selected sub-block in the selected block based on the program verify voltage when the one or more unselected sub-blocks of the selected block have the determined programmed completeness performs one or more of steps 610-618 in FIG. 6 and/or steps 1406 and 1408 of process 1400 (see FIG. 14). In an embodiment the means for verifying selected memory cells in a selected sub-block in the selected block based on the program verify voltage when the one or more unselected sub-blocks of the selected block have the determined programmed completeness comprises one or more control circuits configured to control the timing and magnitude of the voltage signals depicted in FIG. 15 (e.g., one or more of: state machine 262, power control 264, array drivers 224, and/or driver circuits 214).

An embodiment of the non-volatile storage device further includes means for determining a magnitude of a read reference voltage based on a programmed completeness in the one or more unselected sub-blocks of the selected block when the selected memory cells are read and means for reading the selected memory cells in the selected sub-block in the selected block based on the read reference voltage.

In an embodiment, the means for determining a magnitude of a read reference voltage based on the programmed completeness in the one or more unselected sub-blocks of the selected block when the selected memory cells are read includes one or more of memory controller 120, SBM back effect compensation circuitry 157, system control logic 260, state machine 262, processor 156, an FPGA, an ASIC, and/or and integrated circuit.

In an embodiment, the means for reading the selected memory cells in the selected sub-block in the selected block based on the read reference voltage includes comprises one or more of system control logic 260, row control circuitry 220, column control circuitry 210, a sense amplifier, a processor, an FPGA, an ASIC, and/or and integrated circuit. In an embodiment, the means for reading the selected memory cells in the selected sub-block in the selected block based on the read reference voltage comprises one or more control circuits configured to control the timing and magnitude of the voltage signals depicted in FIG. 15 (e.g., one or more of: state machine 262, power control 264, array drivers 224, and/or driver circuits 214).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

a communication interface configured to receive memory commands for accessing a three-dimensional memory structure having blocks, each block having NAND strings and word lines connected to the NAND strings; and one or more control circuits coupled to the communication interface, the one or more control circuits configured to connect to the three-dimensional memory structure, the one or more control circuits configured to:

operate the memory structure in a sub-block mode in which sub-blocks of a block are erased and programmed independently, wherein sub-blocks are a unit of erase;

determine a magnitude for a program verify voltage for a selected word line in a selected sub-block in a selected block during a program verify in the sub-block mode, the magnitude for the program verify voltage depends on a number of the word lines that are programmed in one or more unselected sub-blocks in the selected block when the program verify voltage is applied to the selected word line;

apply the program verify voltage having the magnitude that depends on the number of the word lines programmed in the one or more unselected sub-blocks to the selected word line during the sub-block mode, wherein during the program verify the number of programmed word lines in the one or more unselected sub-blocks in the selected block is in one of a plurality of non-overlapping programmed word line ranges;

sense selected memory cells connected to the selected word line in response to application of the program verify voltage to the selected word line;

read the selected memory cells connected to the selected word line after the selected memory cells have passed the program verify, wherein during the read the number of programmed word lines in the one or more unselected sub-blocks in the selected block is in one of the plurality of non-overlapping programmed word line ranges, including:

apply a first voltage gap between the program verify voltage and a read reference voltage during the sub-block mode when the number of programmed word lines in the one or more unselected sub-blocks in the selected block is within the same range of the plurality of non-overlapping programmed word line ranges during both the program verify and the read of the selected word line, the program verify voltage being a voltage for verifying a first data state, and the read reference voltage being a voltage for reading the first data state; and apply a second voltage gap different from the first voltage gap between the program verify voltage and the read reference voltage during the sub-block mode when the number of programmed word lines in the one or more unselected sub-blocks in the selected block is in a different range of the plurality of non-overlapping programmed word line ranges during the read of the selected word line than during the program verify of the selected word line, including apply a smaller voltage gap than the first voltage gap between the program verify voltage and the read reference voltage responsive to the number of programmed word lines in the one or more unselected sub-blocks in the selected block being in a first range of the plurality of non-overlapping programmed word line ranges during the program verify and a second range of the plurality of non-overlapping programmed word line ranges during the read of the selected word line, wherein the second range has more programmed word lines than the first range.

2. The apparatus of claim 1, wherein the one or more control circuits are further configured to:

establish the program verify voltage to have a first magnitude responsive to a percentage of programmed word lines in the one or more unselected sub-blocks being below a first percentage; and establish the program verify voltage to have a second magnitude responsive to the percentage of programmed word lines in the one or more unselected sub-blocks being above a second percentage that is at least as high as the first percentage, the second magnitude being greater than the first magnitude.

3. The apparatus of claim 1, wherein the one or more control circuits are further configured to:

establish the program verify voltage to have a first magnitude responsive to the one or more unselected sub-blocks being open when the program verify voltage is to be applied to the selected word line; and establish the program verify voltage to have a second magnitude responsive to the one or more unselected sub-blocks being closed when the program verify voltage is to be applied to the selected word line, the second magnitude being greater than the first magnitude.

4. The apparatus of claim 1, wherein the one or more control circuits are further configured to:

apply a larger voltage gap than the first voltage gap between the program verify voltage and the read reference voltage responsive to the number of programmed word lines in the one or more unselected sub-blocks in the selected block being in a third range of the plurality of non-overlapping programmed word line ranges during the program verify and a fourth range of the plurality of non-overlapping programmed word line ranges during the read of the selected word line, wherein the fourth range has fewer programmed word lines than the third range.

5. The apparatus of claim 1, wherein the one or more control circuits are further configured to:

determine a magnitude for the read reference voltage for the selected word line in the selected sub-block in the selected block, the magnitude for the read reference voltage depends on a programmed status of the word lines in the one or more unselected sub-blocks in the selected block when the selected word line is program verified and a programmed status of the word lines in the one or more unselected sub-blocks in the selected block when the read reference voltage is applied to the selected word line;

apply the read reference voltage having the magnitude that depends on the programmed status of the word lines in the one or more unselected sub-blocks in the selected block when the selected word line is program verified and the programmed status of the word lines in the one or more unselected sub-blocks in the selected block to the selected word line during the sub-block mode; and determine whether the selected memory cells connected to the selected word line have a threshold voltage of at least the first data state in response to application of the read reference voltage.

6. The apparatus of claim 5, wherein the one or more control circuits are further configured to:

establish the read reference voltage to have a first magnitude responsive to the one or more unselected sub-blocks being open when the read reference voltage is to be applied to the selected word line whether the one or more unselected sub-blocks were open or closed during the program verify of the selected word line; and establish the read reference voltage to have a second magnitude responsive to the one or more unselected sub-blocks being closed when the read reference voltage is to be applied to the selected word line whether the one or more unselected sub-blocks were open or closed during the program verify of the selected word line, the second magnitude being greater than the first magnitude.

7. The apparatus of claim 5, wherein the one or more control circuits are further configured to:

establish the read reference voltage to have a first magnitude responsive to a number of unprogrammed word lines in the one or more unselected sub-blocks being below a particular percentage when the read reference voltage is to be applied to the selected word line; and establish the read reference voltage to have a second magnitude responsive to the number of unprogrammed word lines in the one or more unselected sub-blocks being above the particular percentage when the read reference voltage is to be applied to the selected word line, the second magnitude being greater than the first magnitude.

8. The apparatus of claim 1, wherein:

the selected block comprises a first sub-block containing a first set of contiguous word lines including the selected word line, the first sub-block being the selected sub-block in the selected block;

the selected block comprises a second sub-block containing a second set of contiguous word lines, the second sub-block being an unselected sub-block of the one or more unselected sub-blocks in the selected block; and the one or more control circuits are further configured to:

establish the program verify voltage to have a first magnitude responsive to the second sub-block having less than or equal to a first percentage of word lines programmed when applying the program verify voltage to the selected word line;

establish the program verify voltage to have a second magnitude responsive to the second sub-block having more than the first percentage of word lines programmed but less than or equal to a second percentage of word lines programmed when applying the program verify voltage to the selected word line; and establish the program verify voltage to have a third magnitude responsive to the second sub-block having more than the second percentage of word lines programmed but less than or equal to a third percentage of word lines programmed when applying the program verify voltage to the selected word line;

the first percentage is less than the second percentage;

the second percentage is less than the third percentage;

the first magnitude is less than the second magnitude; and the second magnitude is less than the third magnitude.

9. The apparatus of claim 1, wherein:

the selected block comprises a first sub-block containing a first set of contiguous word lines including the selected word line, the first sub-block being the selected sub-block in the selected block;

the selected block comprises a second sub-block containing a second set of contiguous word lines, the second sub-block being a first unselected sub-block of the one or more unselected sub-blocks in the selected block;

the selected block comprises a third sub-block containing a third set of contiguous word lines, the third sub-block being a second unselected sub-block of the one or more unselected sub-blocks in the selected block; and the one or more control circuits are further configured to:

establish the program verify voltage to have a first magnitude responsive a word line programmed status in the second sub-block and the third sub-block meeting a first fullness criterion; and establish the program verify voltage to have a second magnitude responsive the word line programmed status in the second sub-block and the third sub-block meeting a second fullness criterion, the second fullness criterion having more word lines programmed than the first fullness criterion, the second magnitude being greater than the first magnitude.

10. A method for operating a memory system, the method comprising:

determining a first degree of programming in an unselected sub-block of a block, the block comprising a plurality of NAND strings and word lines, the block comprising the unselected sub-block and a selected sub-block, the selected sub-block comprising a first set of contiguous word lines, the unselected sub-block comprising a second set of contiguous word lines;

applying a program verify voltage to a selected word line in the selected sub-block, the program verify voltage having a magnitude that depends on the first degree of programming in the unselected sub-block, the selected word line connected to selected memory cells; and determining results of verifying the selected memory cells in response to application of the program verify voltage;

determining a second degree of programming in the unselected sub-block of the block prior to a read while the selected memory cells connected to the selected word line still store data verified with the program verify voltage having the magnitude that depended on the first degree of programming in the unselected sub-block at a time of program verify, the program verify voltage being used to verify a first data state;

applying a read reference voltage to the selected word line, the read reference voltage having a magnitude that depends on the second degree of programming in the unselected sub-block when applying the read reference voltage to the selected word line, the read reference voltage being used to read the first data state; and sensing the selected memory cells in response to application of the read reference voltage.

11. The method of claim 10, further comprising:

establishing the magnitude of the program verify voltage to be a first voltage responsive to a number of programmed word lines in the unselected sub-block being below a particular percentage; and establishing the magnitude of the program verify voltage to be a second voltage responsive to the number of programmed word lines in the unselected sub-block being above the particular percentage, the second voltage being greater than the first voltage.

12. The method of claim 10, further comprising:

establishing the magnitude of the program verify voltage to be a first voltage responsive to the unselected sub-block being open; and establishing the magnitude of the program verify voltage to be a second voltage responsive to the unselected sub-block being closed, the second voltage being greater than the first voltage.

13. A non-volatile storage device, comprising:

a three-dimensional memory structure having blocks, each block having NAND strings and word lines connected to the NAND strings; and one or more control circuits in communication with the three-dimensional memory, the one or more control circuits configured to:

operate the memory structure in a sub-block mode in which sub-blocks of a block are erased and programmed independently, each sub-block being a unit of erase;

determine a magnitude for a program verify voltage for a selected word line in a selected sub-block in a selected block during the sub-block mode, the magnitude for the program verify voltage depends on a first degree of programming of the word lines in one or more unselected sub-blocks in the selected block when the program verify voltage is applied to the selected word line;

apply the program verify voltage having the magnitude that depends on the first degree of programming of the word lines in the one or more unselected sub-blocks to the selected word line during the sub-block mode;

sense selected memory cells connected to the selected word line in response to application of the program verify voltage to the selected word line;

determine a second degree of programming in the one or more unselected sub-blocks of the selected block prior to a read while the selected memory cells connected to the selected word line still store data verified with the program verify voltage having the magnitude that depended on the first degree of programming in the one or more unselected sub-blocks at a time of program verify, the program verify voltage being used to verify a first data state;

apply a read reference voltage to the selected word line, the read reference voltage having a magnitude that depends on the second degree of programming in the one or more unselected sub-blocks when applying the read reference voltage to the selected word line, the read reference voltage being used to read the first data state; and sense the selected memory cells in response to application of the read reference voltage.

* * * * *